United States Patent
Anders et al.

(10) Patent No.: US 10,942,230 B2
(45) Date of Patent: Mar. 9, 2021

(54) DEVICE FOR GENERATING AND DETECTING A MAGNETIC RESONANCE OF A SAMPLE

(71) Applicant: Helmholtz-Zentrum Berlin fuer Materialien und Energie GmbH, Berlin (DE)

(72) Inventors: Jens Anders, Stuttgart (DE); Klaus Lips, Berlin (DE); Maurits Ortmanns, Ulm (DE)

(73) Assignee: HELMHOLTZ-ZENTRUM BERLIN FUER MATERIALIEN UND ENERGIE GMBH, Berlin (DE)

( * ) Notice: Subject to any disclaimer, the term of this patent is extended or adjusted under 35 U.S.C. 154(b) by 387 days.

(21) Appl. No.: 15/779,100

(22) PCT Filed: Nov. 21, 2016

(86) PCT No.: PCT/DE2016/100539
§ 371 (c)(1),
(2) Date: Oct. 25, 2018

(87) PCT Pub. No.: WO2017/088851
PCT Pub. Date: Jun. 1, 2017

(65) Prior Publication Data
US 2019/0041474 A1    Feb. 7, 2019

(30) Foreign Application Priority Data

Nov. 27, 2015  (DE) .......................... 102015120644.7
Feb. 5, 2016   (DE) .......................... 102016102025.7

(51) Int. Cl.
*G01R 33/24*    (2006.01)
*G01N 24/10*    (2006.01)
(Continued)

(52) U.S. Cl.
CPC ............. *G01R 33/24* (2013.01); *G01N 24/10* (2013.01); *G01R 33/3607* (2013.01);
(Continued)

(58) Field of Classification Search
CPC ............. G01R 33/543; G01R 33/5608; G01R 33/4828; G01R 33/3415; G01R 33/283;
(Continued)

(56) References Cited

U.S. PATENT DOCUMENTS

| 5,424,644 A | 6/1995 | Zeiger |
| 5,512,829 A * | 4/1996 | Holczer ................. G01R 33/60 |
| | | 324/316 |

(Continued)

FOREIGN PATENT DOCUMENTS

| DE | 4223909 C2 | 6/1994 |
| DE | 4412064 A1 | 10/1995 |
| JP | 2006334238 A | 12/2006 |

OTHER PUBLICATIONS

T. Yalcin, et al., "Single-chip detector for electron spin resonance spectroscopy", Review of Scientific Instruments, vol. 79, 094105 (2008), Dec. 2008, pp. 094105-1-094105-6.

(Continued)

*Primary Examiner* — Jermele M Hollington
*Assistant Examiner* — Taqi R Nasir
(74) *Attorney, Agent, or Firm* — Leydig, Voit & Mayer, Ltd.

(57) ABSTRACT

A device for generating and detecting a magnetization of a sample includes a magnetic field generator configured to generate a static magnetic field of a predetermined direction and strength at a sample location, a transmitter configured to provide an additional magnetic field at the sample location, and a receiver configured to detect a magnetization of the sample. An assembly of at least two LC oscillators, the (Continued)

oscillation frequency of which is a function of a value of an inductive element of the LC oscillators and which are frequency-synchronized via a wiring, and forced by a control voltage to have a same oscillation frequency, is used as the receiver and/or the transmitter. A controller configured to control the assembly is connected, the assembly and the controller are configured to generate a magnetic field capable of deflecting a magnetization of the sample out of equilibrium.

8 Claims, 14 Drawing Sheets

(51) Int. Cl.
*G01R 33/36* (2006.01)
*G01R 33/60* (2006.01)
*G01R 33/54* (2006.01)
*H03L 7/099* (2006.01)
*G01R 33/30* (2006.01)
*G01R 33/34* (2006.01)
*H03D 5/00* (2006.01)

(52) U.S. Cl.
CPC ............ *G01R 33/54* (2013.01); *G01R 33/60* (2013.01); *H03L 7/0992* (2013.01); *G01R 33/30* (2013.01); *G01R 33/34* (2013.01); *H03D 5/00* (2013.01)

(58) Field of Classification Search
CPC ...... G01R 33/307; G01R 33/24; G01R 33/54; G01R 33/30; G01R 33/34; G01R 33/60; G01V 3/32; E21B 49/08; E21B 2049/085; G01N 24/10
See application file for complete search history.

(56) References Cited

U.S. PATENT DOCUMENTS

| | | | |
|---|---|---|---|
| 9,720,057 B2* | 8/2017 | Cambou | G01R 33/093 |
| 9,766,305 B2* | 9/2017 | Yehoshua | G11C 11/1659 |
| 2008/0169805 A1* | 7/2008 | Cho | G01R 33/1223 324/201 |
| 2013/0328562 A1* | 12/2013 | Grenier | G01R 33/4831 324/309 |
| 2014/0210473 A1 | 7/2014 | Campbell et al. | |

OTHER PUBLICATIONS

Jens Anders, et al., "A single-chip array of NMR receivers", Journal of Magnetic Resonance, vol. 201 (2009), Dec. 2009, pp. 239-249.

N. Bloembergen, et al., "Radiation Damping in Magnetic Resonance Experiments", Physical Review, vol. 95, No. 1, Jul. 1, 1954, pp. 8-12.

Paolo Maffezzoni, et al., "Analysis and Design of Weakly Coupled LC Oscillator Arrays Based on Phase-Domain Macromodels", IEEE Transactions on Computer Aided Design of Integrated Circuits and Systems, vol. 34, No. 1, Oct. 27, 2014 (Oct. 27, 2014), pp. 77-85, XP011567926.

Jens Anders, et al., "K-band single-chip electron spin resonance detector", Journal of Magnetic Resonance, vol. 217, Feb. 18, 2012 (Feb. 18, 2012), pp. 19-26, XP055354363.

Peter Kinget, "Amplitude detection inside CMOS LC oscillators", ISCAS 2006, Dec. 2006, pp. 5147-5150.

Thomas Prisner, et al., "Pulsed EPR Spectroscopy: Biological Applications", Annu. Rev. Phys. Chem. vol. 52, Dec. 2001, pp. 279-313.

Reinhard Benn, et al., "Modern Pulse Methods in High-Resolution NMR Spectroscopy", Angew. Chem. Int. Ed. Engl, vol. 22, Dec. 1983, pp. 350-380.

* cited by examiner

DEVICE FOR GENERATING AND DETECTING A MAGNETIC RESONANCE OF A SAMPLE

CROSS REFERENCE TO RELATED APPLICATIONS

This application is a U.S. National Stage Application under 35 U.S.C. § 371 of International Application No. PCT/DE2016/100539 filed on Nov. 21, 2016, and claims benefit to German Patent Application Nos. DE 10 2015 120 644.7 filed on Nov. 27, 2015 and DE 10 2016 102 025.7 filed on Feb. 5, 2016. The International Application was published in German on Jun. 1, 2017 as WO 2017/088851 A1 under PCT Article 21(2).

FIELD

The invention relates to a device for generating and detecting a magnetic resonance of a sample, such as is used, for example, in electron spin resonance spectroscopy and nuclear magnetic resonance spectroscopy, which are employed, inter alia, in experimental physics, chemistry, medical technology or earth sciences.

BACKGROUND

In electron spin resonance spectroscopy (ESR, also termed EPR, electron paramagnetic resonance) and nuclear magnetic resonance spectroscopy (NMR), samples are exposed, in a statically homogeneous, statically inhomogeneous or dynamic (pulsed inhomogeneous) magnetic field, usually termed B0, to additional high-frequency alternating electromagnetic fields (in ESR mostly in the microwave range between 1 and 263 GHz), usually termed B1.

By coupling alternating fields (B1) of a suitable frequency and polarization, transitions are induced between the energy levels of discrete spin states of the nucleus configuration and/or electron configuration of a sample, which lead for their part to absorption processes in the alternating field, which processes can be detected. Various pieces of analytical information of the sample can be determined from the detected absorption processes. The linearly polarized field B1 is usually oriented perpendicular to B0 in this case.

Samples which are suitable for characterization by ESR or NMR experiments are accordingly all magnetizable samples, i.e. paramagnetic samples (unpaired electrons, ESR) or samples with atomic nuclei having "net nuclear spin" due to an odd number of nucleons (NMR). The samples can be liquid, solid or also gaseous. In the following, the term "sample" is always used in the sense of a magnetizable sample, as introduced above.

For the unambiguous characterization of the energy differences of the spin states (resonance energy) and the associated spectral lines, the spectral components, the gyromagnetic ratio γ or what is known as the g factor, also termed the Landé factor according to $\Delta E = h \cdot \omega = \gamma \cdot B_0 \cdot h = g \cdot \mu_B \cdot B_0$ (h=Planck's constant, $\mu_B$=Bohr magneton, ω=angular frequency of the precession of the magnetic field) can optionally be used. The g factors in this case are not necessarily isotropic and must be treated as tensors if applicable. The spectral components depend here not only of the g factors, but e.g. also of the coupling with adjacent nuclear spins and electron spins. In this case e.g. due to microscopic magnetic interactions inside the sample, the energy difference of spin states can be modified further, which can then be described by what is known as the total Hamiltonian interaction operator. This complex correlation is described below simply by the case of resonance of the spin states to be observed; the respective interactions are not further explained. In the case of resonance, the frequency corresponds to what is known as the Larmor frequency.

In the case of resonance of excitation by the $B_1$ field, what are known as Rabi oscillations occur. These are oscillations in a quantum-mechanical two- or multilevel system, which interacts with an external periodic force (e.g. an oscillating magnetic field). If the excitation frequency is close to the resonance frequency of the transitions, the occupation of the states oscillates at a frequency that is also referred to as a Rabi frequency.

ESR and NMR experiments are usually conducted at or as close as possible to the resonance frequency, as is also presupposed below unless otherwise noted.

In what are known as continuous wave ESR or NMR experiments, the energy that corresponds to permitted or weakly prohibited transitions between different energy levels of spin ensembles (case of resonance) is determined during continuous irradiation with alternating magnetic fields ($B_1$) and any simultaneous change in the strength of the magnetic field ($B_0$).

In what are known as pulsed ESR or NMR experiments, a strong electromagnetic pulse ($B_1$) (transient magnetic field) is used to excite a precession motion of the orientation of the macroscopic magnetization of the sample around the direction of the effective magnetic field in the sample, and its relaxation process as well as the precession frequency are detected, with a static or also dynamic (temporally and/or locally variable) magnetic field $B_0$. The relaxation process is also termed transient (temporally variable) magnetization and what is known as a transient signal is detected. The transient magnetization is limited in its time duration by the spin-lattice relaxation time ($T_1$) and the spin-spin relaxation time ($T_2$). For ESR experiments, these times are in the sub-nano to second range, but the usual measuring windows lie between 1 ns and 1 ms.

To avoid relaxation processes during the excitation, which considerably simplifies the modelling of the experiment, the period of time in which the transient magnetic field ($B_1(t, \omega,)$) is present must be short compared with the relaxation times. Since relaxation times of a sample in the case of ESR can be in the sub-nanosecond range, transient magnetic fields having durations in the sub-nanosecond range (<1 ns) are required for certain samples. In this case, the duration of the transient magnetization depends on the sample, via the correlation with the spin-lattice relaxation time ($T_1$) and spin-spin relaxation time ($T_2$).

In pulsed ESR or NMR experiments, the magnetic field $B_0$ can be a magnetic field that is linearly variable over the location (gradient field), such as is used e.g. in imaging methods based on magnetic resonance.

The physical principles are elaborated in greater detail below. In classic mechanics, a magnetic dipole moment $\vec{\mu}$ in a magnetic field $\vec{B}$ experiences a torque $\vec{\tau}$ according to $\vec{\tau} = \vec{\mu} \times \vec{B}$. Accordingly, in principle any macroscopic magnetization $\vec{M}$ can be influenced in the form of an applied, external magnetic field, because it results from a combined effect of microscopic magnetic moments. ESR or NMR experiments are known examples of this, in which an external magnetic field is applied and a sample magnetization $\vec{M}_s$, which is linked to the spins of electrons or atomic nuclei and their interaction, is determined. Quantum-mechanical observations show that the spin of a particle is not only linked to the magnetic dipole moment $\vec{\mu}$, but also to the orbital angular momentum $\vec{L}$, which are related to one another according to $\vec{\mu} = \gamma \cdot \vec{L}$, comprising the gyromagnetic ratio γ which is specific for a material of a sample. In the simplest case to be considered of spin-½ particles and the assumption that no interaction is present between the spins, the macroscopic magnetization based on the spins can be described within an applied magnetic field $\vec{B}$ by a simplified Bloch equation, i.e. a Bloch function without relaxation terms according to $$\frac{d\vec{M}_s}{dt} = -\gamma \cdot (\vec{M}_s \times \vec{B}). \quad (0.1)$$

It follows from (0.1) that a spin-based magnetization $M_s$, which encloses an angle with a magnetic field $B_0$, executes a precession motion about the axis of the $B_0$ field at an angular velocity that corresponds to what is known as the Larmor frequency $\omega_L = -\gamma \cdot B_0$. A deflection of the magnetization $M_s$ can take place e.g. due to an applied, temporally variable magnetic field $B_1$ which is oriented perpendicularly to $B_0$ and has a frequency $\omega_L$, so that $M_s$ rotates about the axis of the $B_1$ field. Since this case, in which $\vec{M}_s$ is not oriented in parallel with $\vec{B}_0$, corresponds to a state of inequilibrium, relaxation mechanisms cause any transverse magnetization $M_{s\perp}$ to decay to zero and the longitudinal magnetization $M_{s\|}$ in the direction of $B_0$ to be restored, which corresponds to the state of equilibrium $M_{s0}$. This circumstance can be taken into account with the introduction of the relaxation times into the Bloch equation according to (0.1) by $$\frac{d\vec{M}_s}{dt} = -\gamma \cdot (\vec{M}_s \times \vec{B}) + \frac{1}{T_2} \cdot \vec{M}_{s\perp} + \frac{M_{s\|} - M_{s0}}{T_1} \vec{e}_\| \quad (0.2)$$

($t$ = time, $\vec{e}_\|$ = unit vector in the direction of the $B_0$ field).

Article 1 by M. Prisner et al. (Pulsed EPR Spectroscopy: Biological Applications, Annual Review of Physical Chemistry 52, 2001, pages 279-313) provides a summary of pulsed ESR experiments on biological samples, and Article 2 by R. Benn and H. Günther (Modern Pulse Methods in High-Resolution NMR Spectroscopy, Angewandte Chemie (Applied Chemistry) International Edition, Vol. 22, 1983, pages 350-380) provides a summary of pulsed NMR experiments.

DE 42 23 909 C2 discloses a device for measuring magnetic resonance for use in medical technology, in which a solenoid coil is used to generate the magnetic field B0. An assembly used as a transmission or receiving device consists of a split ring resonator. Furthermore, a coupling device is provided for detecting a resonance signal, implemented by a coupling loop. Further circuit units complete the device.

A device described as an electron spin resonance pulse spectrometer is disclosed in DE 44 12 064 A1. Said device comprises a first microwave oscillator for generating scanning signals (measuring signals), B1, and a second microwave oscillator for generating auxiliary signals of a lower microwave frequency. In addition, a first mixer and a pulse-shaping channel for generating mixed signals of a pulse length suitable for electron spin resonance pulse experiments, and a resonator for detection, are provided.

US 2014/0210473 A1 discloses an electron spin resonance spectrometer that is equipped with a probe tip as transmission and receiving device. The excitation field (B1) for the transmission device is generated outside said device and is conducted by suitable means into the probe tip. The spectrometer can also be operated in pulsed mode, the pulses and the detection of the signals being of a temporal duration, but not allowing any time-resolved detection of a transient magnetization of a sample.

In Article 3 by T. Yalcin and G. Boero (Single-chip detector for electron spin resonance spectroscopy, Review of Scientific Instruments 79, 2008, pages 094105-1-6), a method is disclosed by means of which LC oscillators can be used for continuous-wave ESR experiments. The method is based on the principle that the current that flows through the coil of the LC oscillator generates a continuous (continuous wave) microwave magnetic field (B1), to which a sample is exposed. This field (B1) influences the magnetization of the sample, which can in turn be detected in the LC oscillator as a change in the frequency. The B field and the magnetic field strength H1 within a linear sample are proportional to one another at sufficiently (sample-dependent) low frequencies of the B1 field. This corresponds to a real-valued relative permeability μγ and the susceptibility χm of the sample, the correlation of which is μγ=1+χm. At higher frequencies of the B1 field a time shift can occur between the B1 field and the field strength H1. This time shift can be mapped for the special case of sinusoidal time curves as complex permeability and susceptibility of the sample, according to $$\mu_r = \mu'_r - j \cdot \mu''_r$$

and $$\chi m \chi' m - j \chi'' m$$

The complex permeability and susceptibility are described in greater detail for example in Article 4 by N. Bloembergen and R. V. Pound (Radiation Damping in Magnetic Resonance Experiments, Physical Reviews, Vol 95 (1), 1954, pages 8-12). The correlation between the static magnetic field B0, the microwave field B1 and the magnetization of the sample Ms is introduced taking account of a complex magnetization of the sample, which links the microwave field strength H1, according to H1=B1/μ0 (μ0=magnetic field constant) to the stationary magnetization of a spin ensemble Mx under continuous wave excitation as $M_x = (\chi' \cdot \cos(\omega_{osc0} \cdot t) + \chi''' \cdot \sin(\omega_{osc0} \cdot t)) \cdot 2H_1$ where ωosc0 is the frequency of the magnetic field strength H1, the free oscillation frequency, and t is the time. The free oscillation frequency of the oscillator must correspond to or be close to the Larmor frequency under excitation conditions. The change in the oscillation frequency, under the influence of the magnetized sample, compared with the free oscillation frequency corresponds, for sufficiently small spin ensembles (i.e. non-linear effects are negligible), to the term $$\Delta\omega_{osc-\chi} = 1/2\omega_{osc0}\eta\chi', \quad (0.3)$$

with η=fill factor. The term results from a first-order Taylor series approximation, it being possible to ignore the higher orders with little loss of accuracy.

One challenge for ESR or NMR experiments is the implementation as "single-chip" (single-chip processor) embodiments having integrated circuit technology, which make the application of the experiments user-friendly, miniaturized, low-cost and energy-efficient compared with conventional embodiments.

Miniaturized detectors in EPR and NMR devices improve the detection limit of said devices with regard to the required number of spins in a volume recorded by the detector, with which a magnetization can be detected reliably, i.e. the spin sensitivity is improved. The spin sensitivity is scaled in this case so as to be proportional to the diameter of the coil/the detector. An isotropic scaling (with the same B0 field and at the same temperature) by three orders of magnitude brings an increase of two orders of magnitude. The spin sensitivities range in this case in orders of magnitude from approx. $10^{11}$ spins/G·$\sqrt{Hz}$ for volume resonators with a few ten to hundred microliters active volume and from approx. $10^8$ spins/G·$\sqrt{Hz}$ for miniaturized coils with approx. one nanoliter active volume, which signifies an improvement of the miniaturized coils relative to the volume coils of a few orders of magnitude. In contrast, too significant a miniaturization is simultaneously associated with the disadvantage that the measuring result is not valid for a reliable determination of a small concentration of spins or of a magnetization for a larger volume in a sample or of a sample in its entirety, i.e. the concentration sensitivity is lost. Here, the concentration sensitivity of a coil of 100 μm diameter (~100 pl sensitive volume) is approx. 1 mmol/l up to a few 100 mmol/l.

One approach to exploiting the advantages of miniaturization and at the same compensating for the disadvantages of the loss of detection in the volume is disclosed in Article 5 by J. Anders et al. (A single-chip array of NMR receivers, Journal of Magnetic Resonance 201, 2009, pages 239-249). The device presented comprises an assembly of eight separate channels, each consisting of a detection coil, a tuning capacitor, a low-noise amplifier and a 50Ω isolation amplifier. Each detection coil has a diameter of 500 μm, resulting in an active (detector) surface area of 1 mm×2 mm. A disadvantage of this device is that the excitation of the spins in the sample does not take place in an integrated manner (per coil). A complete receiving device (consisting of at least: low-noise pre-amplifier, mixer, further amplifier, ADC converter) is also required per coil, making the device costly.

Miniaturization should be understood in general here as what is implemented in integrated circuit technology, such as CMOS (complementary metal oxide semiconductor) and in its orders of magnitude and smaller.

Another disadvantage of many devices known from the prior art for ESR and NMR measurements are their high levels of energy consumption. These result from the fact that the systems, with the exception of a few miniaturized devices implemented in integrated circuit technology, are designed for a 50Ω environment, resulting in relatively high powers for generating the additional alternating field (B1). Further simplification of the systems proposed hitherto is also to be aimed for, in order to be able to implement said systems in a lower-cost and more compact manner.

SUMMARY

In an embodiment, the present invention provides a device for generating and detecting a magnetization of a sample. The device includes a magnetic field generator configured to generate a static magnetic field of a predetermined direction and strength at a sample location, a transmitter configured to provide an additional magnetic field at the sample location, and a receiver configured to detect a magnetization of the sample. An assembly of at least two LC oscillators, the oscillation frequency of which is a function of a value of an inductive element of the LC oscillators and which are frequency-synchronized via a wiring, and forced by a control voltage to have a same oscillation frequency, is used as the receiver and/or the transmitter. A controller configured to control the assembly is connected, the assembly and the controller are configured to generate a magnetic field capable of deflecting a magnetization of the sample out of equilibrium, and the sample location lies in a near field of the assembly. A demodulator and analog-to-digital converters as well as a digital data processor are connected downstream of the assembly for processing an output voltage of the assembly. A spectral component determiner configured to determine spectral components of the magnetization of the sample and the spin concentration of individual spectral components to be determined therefrom and an output configured to output the magnetization are provided in the digital data processor. One of the LC oscillators in the assembly is executed as a voltage-controlled oscillator and a phase locked loop is connected, so that all LC oscillators in the assembly follow a reference frequency.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Figure 1:
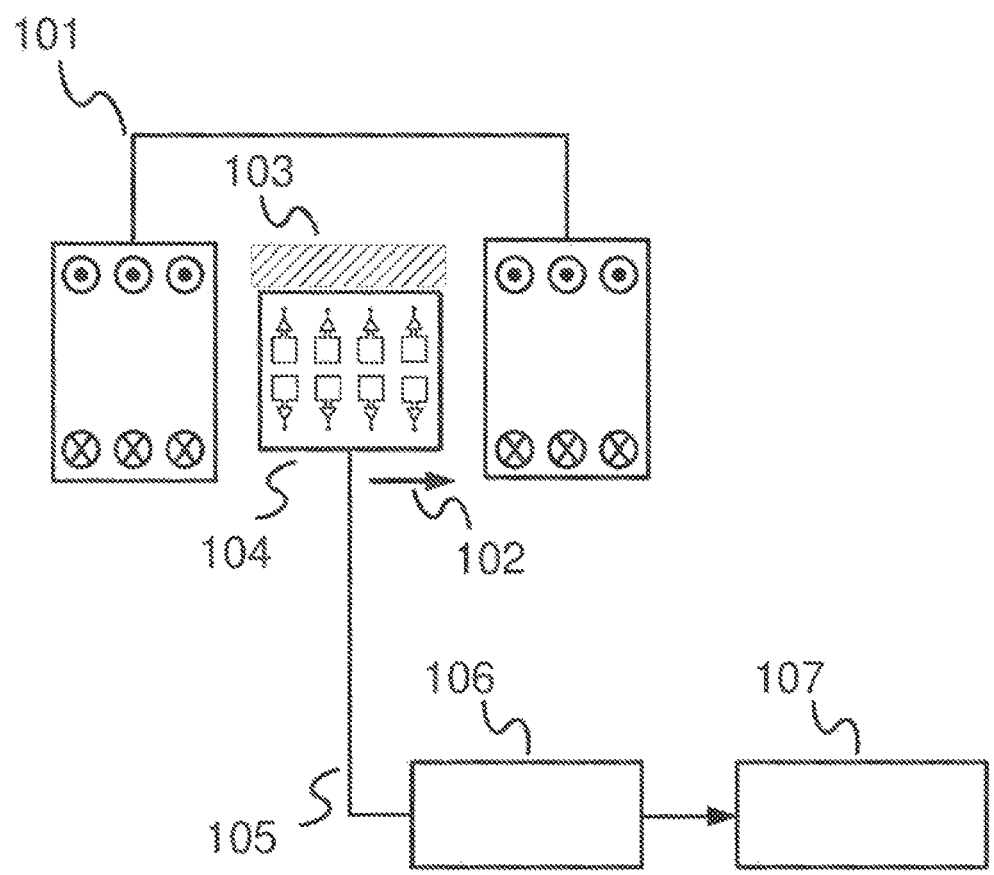
FIG. 1 is a schematic view of a device for generating and detecting magnetic resonance.

Embodiments of the present invention provide devices for generating and detecting a magnetic resonance of a sample, wherein the devices have a high spin sensitivity compared with the prior art at the same time as having a higher concentration sensitivity compared with the prior art, and are in addition constructed in a simplified and energy-saving manner.

According to embodiments of the invention, the means for generating a magnetic field of a predetermined direction is implemented, for example, by superconducting magnets or electromagnets of any design or permanent magnets. The magnetic field generated is static and corresponds to the magnetic field $B_0$, which is used to magnetize a sample suitable for magnetization. The magnetic field can be of any strength here, as long as the frequency of the exciting $B_1$ magnetic field is selected according to the resonance conditions.

Solid, gaseous and liquid samples are possible as samples. Liquid samples can be placed e.g. in glass capillary tubes on planar models (e.g. in CMOS technology). At lower frequencies of $B_1$ up to what is known as the X band (approx. 10 GHz) the coils of the LC oscillators can also be implemented as volume coils, into which the capillary tubes comprising liquid samples can be introduced, or can be combined with (micro-) fluidic systems for transporting samples into the detector. Alternatively, the device can also be immersed in or introduced into the liquid, gas or solid to be measured, or linked thereto in another way, e.g. via spraying. Phase transitions and changes (transitions) of states of matter can be detected in this way.

The sample location is a location in the device at which the sample is arranged and at which both the magnetic field ($B_0$) and, if applicable, the transient magnetic field ($B_1$) are applied. Means for attaching and storing the sample can be provided here.

An assembly of at least two LC oscillators forms either the receiving device or the transmission device, each as a sole function, or also the transmission and receiving device simultaneously (this means one device which fulfils both functions).

In the event that the assembly only forms the receiving device, the transmission device is formed of means known from the prior art, such as coils, conductor strips, resonators or antennae.

In the event that the assembly only forms the transmission device, the receiving device is formed of means known from the prior art, such as resonators, antennae, coils or conductor strips.

In the event that the assembly simultaneously forms both the transmission device and the receiving device, no other means are required as a transmission device for manipulating a magnetization of a sample (in addition to the magnetic field $B_0$) and as a receiving device for detecting a magnetization of a sample.

In particular, the embodiment in which the transmission device and receiving device are both formed by a common assembly is advantageous, as it facilitates a particularly simplified, cost- and space-saving construction.

Here, in all three cases cited above, each LC oscillator of the assembly assumes one of the three functions of: receiving, transmission or a combination of transmission and receiving device, according to the utilization of the assembly.

The LC oscillators are designed such that their oscillation frequency is dependent on the value of an inductive element of the LC oscillators. LC oscillators that meet this requirement are e.g. Hartley, Colpitts or Armstrong oscillators or LC tank oscillators. In this case, the LC oscillators can be both implemented as LC oscillators having a fixed working frequency and designed for an entire frequency band by the use of tunable (electrically or mechanically) inductors and/or capacitors.

In this case, the assembly of the LC oscillators is selected according to embodiments of the invention such that the sample or the sample location is situated in the near field of the LC oscillators.

In this case, the near field should be understood, for a device according to an embodiment of the invention, as the field of the LC oscillator in which the rotation of the $B_1$ field and, on account of div B=0, also the total $B_1$ field, is essentially determined via the current density J in the inductive element by rot $\vec{B} \approx \mu_0 \cdot \vec{J}$ ($\mu_0$=magnetic field constant). In contrast to this, wave propagation takes place in the far field and the $B_1$ and $E_1$ field (electric field) are generated reciprocally by rot $\vec{B}_1 \approx \mu_0 \cdot \epsilon_0 \partial \vec{E}_1 / \partial t$, where $\epsilon_0$=electric field constant, t=time. For the near field it therefore applies that the $B_1$ field can be generated largely independently of the $E_1$ field, as no wave is yet present in the region of the near field. Due to this circumstance the $E_1$ field can be optimized and/or can be kept small. Small $E_1$ fields minimize electrical losses in the sample and the loss arising due to the heating of the sample, which is an advantage of the device according to the invention.

If there are more than two LC oscillators, spatial design of the assembly of the LC oscillators takes the form of a planar composite system of individual LC oscillators, preferably in rows and columns (also termed "array"). Any assembly of the LC oscillators in relation to one another can also be implemented. The special case of a single row or chain is included here. In this case, the definition "planar" includes, apart from a flat implementation, also surfaces of any desired curvature, with and without an edge (e.g. cylinder surface, cone surface, sphere).

A high spin sensitivity is achieved according to the degree of miniaturization, which can be achieved at least up to sizes of 20 μm for the individual LC oscillators. The assembly of a plurality of LC oscillators, which are frequency-synchronized, makes it possible to achieve a high concentration sensitivity depending on the number of LC oscillators, as the active surface area of the receiving device is enlarged thereby. The frequency synchronization (frequency locking) of the LC oscillators in the assembly ensures that interactive, homogeneous manipulation of a magnetization of a sample is produced and interactive detection with a common read-out of the oscillation frequency of the assembly for determining a change in a magnetization of a sample (caused by the manipulation) as the sum of all LC oscillators in the assembly and thus of the active surface area takes place.

The degree of miniaturization of individual LC oscillators that is attainable depends here on the manufacturing technology and the selection of the embodiment of the coils. Possible embodiments of the coils apart from the known coils in LC oscillators are e.g. coils of superconducting material or in the form of a stripline (e.g. also nanowires), magnitudes in the nanometer range being attainable. An embodiment of the coils at atomic or molecular level is also theoretically conceivable.

Frequency synchronization (frequency locking) means here that the LC oscillators, compelled by circuitry means, have the same free oscillation frequency.

The frequency synchronization of the LC oscillators is implemented in one embodiment by wiring as a coupling network. "Wired by a coupling network" means that the oscillation signal of one oscillator is fed by passive or also active circuit elements into one or more other oscillators of the array. The effect of this is that the output signals of all oscillators oscillate at the same frequency. In this case, the phase of the oscillation depends on the coupling network. This has the advantage that the frequencies of the oscillators are thus synchronized, and a possibly desirable fixed phase shift can also be set between the oscillation signals of the oscillators by suitably selecting the coupling network. Depending on the type of coupling network, the phase noise thus reduces compared with the phase noise of a single oscillator. In passive coupling networks, the power consumption is lower compared with active networks.

In another embodiment, the frequency synchronization of the LC oscillators is implemented by a network wiring, each LC oscillator having an additional input, and an output voltage, at least of one further LC oscillator, being fed into the additional input, the LC oscillators being interconnected at least bilaterally in each case. The effect of this is likewise that the output signals of all the oscillators oscillate at the same frequency. The phase is likewise dependent on the coupling network. This also has the advantage here that the frequencies of the oscillators are thus synchronized, and a possibly desirable fixed phase shift can also be set between the oscillation signals of the oscillators by suitably selecting the network wiring. Since, as a first approximation, this is a unidirectional network, the construction is simpler than in the case of passive coupling networks.

In a next embodiment, the LC oscillators are implemented by LC-VCOs (Voltage Controlled Oscillator). The use of LC-VCOs allows an independent adjustment of frequency and amplitude of the oscillator and thus frequency and amplitude of the $B_1$ field, which is advantageous for optimization of the experimental conditions. The independent adjustment of frequency and amplitude is achieved through knowledge of the residual coupling, which is determined by one-time measurement of the corresponding background signal and then subtracted accordingly, and by corresponding compensation during the measurement.

The circuit layout of the individual LC-VCOs is preferably as follows. A differential capacitance diode (varactor) and a differential inductor are used to form the LC resonant circuit. Two cross-coupled transistors ensure a stable oscillation in the differential output (i.e. the output voltage) by negative resistance and non-linearity between two nodal points. The tuning properties are ensured by the differential capacitance diode. A time-dependent variation of the oscillation amplitude is e.g. implemented by manipulation of the voltage supply of the LC-VCO. This simple embodiment of an LC-VCO ensures low power consumption, a small space requirement and also operates even at low (down to cryogenic) temperatures.

The changes in the oscillation frequency of the assembly of LC oscillators are detected by demodulation downstream of the assembly of LC oscillators. The demodulation takes place using a frequency demodulator. The analog signals are converted into digital signals on the basis of the selected converters or demodulators before or after the conversion or demodulation using suitable means.

Changes in the oscillation amplitude are detected by means connected downstream of the assembly of LC oscillators. The amplitude of the individual LC oscillators in the assembly is not synchronized by the coupling. A signal can therefore be tapped in each case at each individual LC oscillator, which signal corresponds to the magnetization of the sample in the sensitive volume of this LC oscillator. Additional signals are thereby obtainable that permit a spatial resolution. It should be taken into account here that the amplitudes of the LC oscillators are subject to a coupling within the LC oscillator, to which the signals must be corrected. The amplitude-modulated signal can be tapped at the individual LC oscillators by simple means. For this purpose, each LC oscillator only requires an amplifier for the signal (normally kHz range in continuous wave experiments), which by the intrinsic demodulation, which is directly available in the baseband when using a current source to supply the LC oscillator, and is tapped at nodes in the LC oscillators. The signal does not have to be down-converted from the Larmor frequency in the process. As well as the complexity of the circuit the power consumption is also optimized thereby.

The analog signals are converted into digital signals on the basis of the selected converters or demodulators before or after the conversion or demodulation.

In continuous wave mode, the means for determining spectral components of the sample, which is provided on the means for digital data processing, implements a determination of spectral components that corresponds to the term (0.3).

In this case, in continuous wave mode the assembly can be used as a transmission device, a receiving device or as a transmission and receiving device. For use exclusively as a receiving device, however, it should be taken into account that the LC oscillators always also generate a $B_1$ field during operation (see above), which may have a manipulative effect on the sample.

To implement the means for control, two options are available in continuous wave mode. In the first, means for generating a first waveform, which is fed into the LC oscillators as control voltages, and if applicable a second waveform for adjusting the envelope curve, are used as means for controlling the assembly of LC oscillators. These means are, for example, digital-to-analog converters, controlled by personal computers, FPGA (Field Programmable Gate Array), microcontrollers, "arbitrary waveform" generators or function generators for simple ramps or pulses. The waveforms are used to carry out a frequency sweep through the resonance frequency corresponding to the $B_0$ field provided, it being possible for a signal of sinusoidal shape in the kHz range to be superposed on the sweep in order to carry out, if applicable, phase-sensitive detection by means of a lock-in amplifier. As a second option, the means described in Article 3 by T. Yalcin and G. Boero for conventional field modulation are used, which means apply a direct voltage to the inputs for the control voltages of the LC oscillators.

The device can also be used for generating and detecting a transient magnetization of a sample. The following statements for the generation and detection of a transient magnetization refer to the use of the assembly of LC oscillators simultaneously both as a transmission and as a receiving device. For the other two cases, use respectively only as a transmission or as a receiving device, only those parts that concern the respective function should be considered. The transmission or receiving devices are then implemented accordingly by known means.

A transient magnetic field $B_1(t,\omega)$ (i.e. a magnetic field having a time-limited changed frequency $\omega$) in the LC oscillator is generated by suitable injection of voltages into voltage-controlled capacitors (varactors). Transient magnetic fields here are magnetic fields that are generated by a change in the frequency in the LC oscillator, which change is of limited duration. The form of the change is not restricted here and can occur for example in a stepped form, a sawtooth-shaped form or as a peak.

In this case, the transient magnetic field $B_1(t,\omega)$) can be shortened to a period of time that is so much shorter than the transient magnetization that relaxation effects during the pulse are negligible. Since transient magnetizations of a sample in the case of ESR can lie in the sub-nanosecond range, transient magnetic fields with durations in the sub-nanosecond range (<1 ns) are also necessary for certain samples. The duration of the transient magnetization is dependent here on the sample via the correlation with the spin-lattice relaxation time ($T_1$) and the spin-spin relaxation time ($T_2$).

Moreover, embodiments of the invention advantageously provide the possibility of detecting a transient magnetization of a sample while the transient magnetic field is being applied, since, unlike in the case of the resonator-based ESR detectors known from the prior art, the detection electronics do not have to be protected from the strong electromagnetic excitation pulses. This is based on the fact that, when using an LC oscillator as a transmission and receiving device, the $B_1$ field for exciting the magnetization in the sample is generated in the oscillator itself by the current in the coil. In this case, on account of the very good conversion of current into a $B_1$ field (Biot-Savart Law, near field) the currents occurring during operation (depending on the size of the coil these are 10 mA to 200 mA) are sufficient for $B_1$ fields that are greater than 1 mT, which in turn make possible the short pulses required (10 mT corresponds approximately to a pulse length of 1 ns). In this case, the oscillator is not damaged or irreversibly changed during operation to generate normal field strengths. The time resolution and the sensitivity of the measurements are improved. This is achieved principally by the fact that the measurement can begin sooner (still during the excitation/the pulse) and thus before the onset of significant relaxation effects.

The duration, number and shape of the transient magnetic fields are selected according to the demands of the sample and the desired manipulation of the spin ensemble in the sample.

In the simplest case, the pulse length should be selected depending on the sample such that the magnetization in the sample is tilted by $\theta=90°$ ($\theta=\gamma \cdot B_1 \cdot \tau_{puls}$, $\tau_{puls}$=duration of application of the resonant $B_1$ field, $\gamma$=gyromagnetic ratio), as in certain cases the transverse magnetization is maximized in this way, which is also detected by the LC oscillator according to the invention. In general, however, any other angle of rotation can be set or used if this is advantageous for the experiment decided upon in each case.

Using devices according to embodiments of the invention, the strength of the $B_1$ field can be made sufficiently great as to generate e.g. 90° pulse lengths ($\theta=90°$) with $\tau_{puls}$ in the sub-nanosecond range, so that as a result of this, in combination with the possibility of detection during the excitation, even what are known as Rabi oscillations for samples with short $T_2$ relaxation times can be measured directly. The strength of the $B_1$ field is set in this case by suitably selecting the oscillator supply voltage or the oscillator quiescent current and by selecting a suitable coil inductance in relation to the frequency-determining capacitance.

The voltages fed in at the voltage-controlled inductor or capacitor of the voltage-controlled LC oscillators used to excite the spin ensembles are present in the form of time-dependent waveforms. The time-dependent waveforms are characterized in that they contain a limited-duration change in the voltage strength. The changes in the voltage bring about the transient magnetic field $B_1(t,\omega)$ in the voltage-controlled LC oscillator that has a changed frequency. Depending on the embodiment of the varactor, an increase or reduction in the voltage can lead here to either a lowering or a raising of the frequency. The advantage when operating the LC oscillator at a lower oscillation frequency than the resonance frequency is that the LC oscillator can be designed as a whole for a lower oscillation frequency. The advantage when operating the LC oscillator at a higher oscillation frequency than the resonance frequency is that signal demodulation is simplified. The form of the change is likewise not restricted here and can occur for example in a stepped form, a sawtooth-shaped form or as a peak. The selection of the frequencies is geared to the required power density at the resonance frequencies of the sample. The duration, number and shape of the time-dependent waveforms are selected according to the demands on the transient magnetic field predetermined by the sample (see above).

Since a current flows through the coil of the LC oscillator as soon as said oscillator is turned on, a $B_1$ field is also directly generated. The amplitude of the $B_1$ field needs a certain time, however, until it has reached a desired value. It is therefore advantageous to switch the LC oscillator from a first frequency, which lies far enough from the resonance frequency not to cause any excitation in the sample, to a second frequency (resonance frequency), as in this way transient response is reduced to negligible, extremely short changes in the amplitude. For the times in which no excitation of the sample magnetization is to take place, the LC oscillator should generally be operated constantly at the first frequency in order to avoid or sharply reduce transient responses.

As in continuous wave mode, a first, here time-dependent, waveform is supplied to the LC oscillators as a control voltage.

A second, here likewise time-dependent, waveform, which is sufficient for adjusting the envelope curve of the transient magnetization of the LC oscillators, is fed in at the supply voltages of the LC oscillators, if necessary with the aid of further circuit elements. A freely selectable envelope primarily allows for enlargement of the homogeneous bandwidth of the excitation of the transient magnetic field, whereby a plurality of spectral lines can be excited homogeneously.

In each case, the frequency and envelope (envelope curve) of the transient magnetic field $B_1(t,\omega)$, which is generated thus by the individual LC oscillators, is sufficient for deflecting a magnetization of a sample in the $B_0$ field out of its state of equilibrium. This applies e.g. to experiments for detecting Rabi oscillations, spin echoes or in simple FID (free induction decay) measurements, for which single pulses are sufficient.

Means for generating the first and second time-dependent waveform, which are fed into the assembly of LC oscillators, are used as means for controlling the assembly of LC oscillators. These means are, for example, digital-to-analog converters, controlled by personal computers, FPGA (Field Programmable Gate Array), microcontrollers, "arbitrary waveform" generators or, for simple ramps, pulse function generators.

Simultaneously to the transient magnetic field $B_1(t,\omega)$, acting on the sample and/or temporally consecutively thereto, the time-dependent change in the magnetization (transient) of the sample is detected. The change in the magnetization of the sample causes a change in the inductive elements of the LC oscillators, which can be detected as a change in the oscillation frequency and/or oscillation amplitude of the LC oscillators in an output voltage thereof. For this purpose, the output voltage of the LC oscillator is tapped and, if applicable, an amplitude-modulated signal of the oscillators is tapped directly at internal voltage nodes.

The changes in the oscillation frequency and/or oscillation amplitude are detected by means for demodulation connected downstream of the assembly of LC oscillators. The demodulation takes place in this case either using a frequency demodulator or an amplitude demodulator, in a manner corresponding to embodiments in each case. A combination of a frequency demodulator with an amplitude demodulator corresponds to another embodiment. The analog signals are converted into digital signals on the basis of the selected converters or demodulators before or after the conversion or demodulation.

The digital, converted and/or demodulated signals are supplied to a means for digital data processing. There they are input into a model of transient inductance and transient resistance of a coil for determining the original spectral lines of a sample, to determine resonance energies, e.g. expressed via the Landé factor (g factor/g tensor) or the ratio of resonance frequencies of a sample and $B_0$.

The model of transient inductance and transient resistance of a coil is derived in detail in the German patent application DE 10 2015 120 644.7. According to this model, the frequency of an LC oscillator, which has a sample with a temporally variable magnetization in the excitable region of its coil, is established according to the term $$\omega_{osc,\chi} = \frac{1}{\sqrt{L_0 \cdot C}} - \frac{1}{2} \cdot \frac{1}{(L_0 \cdot C)^{\frac{3}{2}}} \cdot C \cdot \Delta L_{sample} \qquad (1.1)$$

$$= \frac{1}{\sqrt{L_0 \cdot C}} - \frac{1}{2} \cdot \frac{1}{(L_0 \cdot C)^{\frac{3}{2}}} \cdot \frac{\Delta L_{sample}}{L_0}$$

$$= \omega_{osc0} - \frac{1}{2} \cdot \omega_{osc0} \cdot \frac{\Delta L_{sample}}{L_0}$$

with C=capacitance of the coil, $L_0$=sample-independent inductance of the, $\Delta L_{sample}$=sample-dependent change in the inductance of the coil.

According to the model of transient inductance and transient resistance of a coil, in which an inductance $L(t)$ of the coil is replaced by a combination of a sample-independent expression $L_0$ of the inductance of the coil and a sample-dependent expression $\Delta L_{sample}$ for the detectable inductance of the sample in the transient magnetic field according to $L(t)=L_0(t)+\Delta L_{sample}(t)$, the following expressions are established for $L_0$, $\Delta L_{sample}$ and $R_{sample}$ (temporally variable loss in the coil, which is caused by the magnetization of the sample):

$$L_0 \equiv 2 \cdot \int_V \left[ \frac{1}{\mu_0} \cdot \vec{B}_u^2(\vec{r}) \right] dV \qquad (1.2)$$

$$\Delta L_{sample}(t) \equiv \int_{V_s} \left[ -\vec{B}_u(\vec{r}) \cdot \frac{\vec{M}(t,\vec{r})}{i(t)} \right] dV \qquad (1.3)$$

$$\frac{d}{dt}\Delta L_{sample}(t) + R_{sample}(t) = \int_{V_s} \left[ -\vec{B}_u(\vec{r}) \cdot \frac{\frac{d}{dt}[\vec{M}(t,\vec{r})]}{i(t)} \right] dV \leftrightarrow \qquad (1.4)$$

$$R_{sample}(t) \equiv \int_{V_s} \left[ -\vec{B}_u(\vec{r}) \cdot \frac{\frac{d}{dt}[\vec{M}(t,\vec{r})]}{i(t)} \right] dV - \frac{d}{dt}\Delta L_{sample}(t), \qquad (1.5)$$

with V=volume, $V_s$=sample volume, $\vec{B}$=unitary magnetic field, $i(t)$=the current flow associated with the voltage drop $v(t)$ of the coil and $\vec{M}$=macroscopic magnetization, magnetization of the sample. The magnitude $L_0$ can be determined directly via the geometry of the coil.

It follows from equation (1.5) that the presence of a temporally variable magnetization leads to a change in the inductance in the sample, which is proportional to the integral of said magnetization over the entire sample, which is normalized to the current flow in the induction coil according to $$\Delta L_{sample}(t) \equiv \int_{V_s} \left[ -\vec{B}_u(\vec{r}) \cdot \frac{\vec{M}(t,\vec{r})}{i(t)} \right] dV = \int_{V_s} \left[ -\vec{B}_1(\vec{r}) \cdot \frac{\vec{M}(t,\vec{r})}{i^2(t)} \right] dV \qquad (1.6)$$

Since the inductance $\Delta L_{sample}$ based on the sample is proportional to the integral of the magnetization of the sample (normalized to the current flow in the coil), a temporally variable magnetization of a sample can be determined by detecting the instantaneous value of the oscillation frequency of the LC oscillator ($\omega_{osc,\chi}$). In addition, the spectral components of the inductance belonging to the sample at $\omega_{osc0} \pm \omega_i$, which are produced by the change in the inductance of the sample-based portion $\Delta L_{sample}$, cause a modulation of the frequency of the oscillator with the modulation frequency $\omega_{osc0} \pm \omega_i$, and thus generate spectral components in the voltage of the oscillator at $\omega_{osc0} \pm (\omega_{osc0} \pm \omega_i)$. These spectral components can be determined by standard demodulation of the frequencies (FM, frequency modulation), from which also the inductance of the sample $\Delta L_{sample}$ can be determined and consequently also its magnetization and the associated spectral components and resonant behavior. The intensity and the dynamics of the magnetization of a sample can therefore be detected at a high time resolution.

The oscillation amplitude of an oscillator depends heavily on the resistance of the coil. In a generalized manner, it is possible to proceed from the following term for the oscillation amplitude $A_{osc}$ of an LC oscillator, biased by a current source:

$$A_{osc} = A_{osc}\bigg|_{R_{eff}=R_0} + \frac{\partial A_{osc}}{\partial R_{eff}}\bigg|_{R_{eff}=R_0} \cdot R_{sample,tot} \qquad (1.8)$$

with $R_{eff}$=effective resistance of the coil, $R_0$=ohmic coil resistance and $R_{sample,tot}$=resistance of the coil induced by the sample.

In the case of an LC tank VCO comprising a current source for supplying the cross-coupled transistor pair, the equation (1.8) is specified to $$A_{osc} = \qquad (1.9)$$
$$8 \cdot \sqrt{\frac{2}{3}} \cdot \frac{n \cdot i_{BIAS}}{G_m} \cdot \sqrt{1 - \frac{2 \cdot R_0}{\omega_{LC}^2 \cdot L_0^2}} + \frac{\partial A_{osc}}{\partial R_{eff}}\bigg|_{R_{eff}=R_0} \cdot R_{sample,tot}$$

with n=emission factor in the sub-threshold range and $I_{BIAS}$=DC quiescent current of the oscillator (bias current).

The functions (1.8) and (1.9) are established on the basis that, under most experimental conditions, the coil resistance $R_0$ is significantly greater than the sample-induced change in the coil resistance $R_{sample,tot}$. In contrast to the sample-induced change in the inductance $\Delta L_{sample}$, the sample-induced change in the resistance $R_{sample,tot}$ leads to modulations in the amplitude of the oscillation frequency of the coil, which produce spectral portions in the oscillator output voltage at $\omega_{osc0}\pm(\omega_{osc0}\pm\omega_i)$, which can in turn be determined by standard demodulation of the amplitude (AM, amplitude demodulation) and thus also the magnetization and the associated spectral components and resonant behavior.

The functions and relationships established in the model of transient inductance and transient resistance of a coil are valid also for the continuous wave mode by a selecting parameters correspondingly.

Accordingly, the spectral components of the magnetization can be detected at frequencies of $(\omega_{osc0}\pm\omega_i)$, in accordance with conventional FM and AM demodulation and, since the oscillation frequency $(\omega_{osc0}$ is known, spectral components can thus be associated unambiguously and quantitatively at the frequencies $\omega_i$.

The complexity involved in carrying out FM and AM demodulation may differ, and therefore differences result here in the detector hardware. For example, in the case of the LC tank oscillator there is a node with intrinsic AM demodulation, at which said demodulation can be tapped. Principles for amplitude detection in a CMOS LC oscillator are given in Article 6 by P. Kinget (Amplitude detection inside CMOS LC oscillators, 2006 IEEE International Symposium on Circuits and Systems, Vol. 1-11, Proceedings 2006, pages 5147-5150). For the FM demodulation e.g. phase locked loops (analog or digital) or what are known as Teager energy operators are used.

Detection of both spectra (frequency and amplitude of the output voltage) holds the advantage that an intrinsic "baseline calibration" can be undertaken, i.e. spectral components that appear in both spectra are to be regarded as genuine, whereas all others are what are known as measuring artifacts.

The means for determining spectral components of the sample, which means is provided on the means for digital data processing, e.g. in the form of a computer program, comprises, in the case of transient magnetizations of the sample, terms that correspond to the terms (1.1) and/or (1.8), the terms (1.2) to (1.6) of the model of transient inductance and transient resistance of a coil being taken into account, as also corresponds to embodiments. In the case of an experiment in continuous wave mode, the means for determining spectral components of the sample comprise a term that corresponds to the term (0.3).

The spectral components determined, in continuous wave mode and in the case of transient magnetization of a sample, are used to determine spin concentrations (even temporally vibrating) of spectral components of certain spin ensembles and their resonance energies, e.g. expressed by the Landé factor (g factor/g tensor) or the ratio of resonance frequencies of a sample and $B_0$, and are output by means suitable for this, which are likewise provided on the means for digital data processing. The information that is output can then be used e.g. for use in process control or quality control and for imaging magnetic resonance tomography.

For some applications, e.g. in transient experiments and to suppress artifacts, it is necessary in ESR and NMR experiments to purposefully set the phase of the exciting $B_1$ field, in order to thus purposefully set the coherence transfer pathway. When using the assembly of LC oscillators according to the invention in the function of a receiving device this can be implemented in that at least one of the LC oscillators is implemented as a voltage-controlled oscillator, in order thus to implement a synchronization with an external reference frequency, e.g. by means of a phase locked loop, so that all LC oscillators in the assembly follow the reference frequency, as corresponds to one embodiment. Pulsed experiments can then be achieved by switching over, e.g. by means of an analog multiplexer, between two different reference frequencies which correspond to an oscillation frequency of the assembly in resonance and out of resonance. What is known as phase cycling can additionally be implemented by switching between different reference signals with the same frequency (in resonance) and different phases. The different phases can advantageously be generated e.g. by frequency dividers from a higher reference frequency. Due to the phase cycling, i.e. the successive excitation with pulses of different phases, signals corresponding to certain transitions can be purposefully suppressed or read out.

The assembly of LC oscillators according to the invention can be implemented in integrated circuit technology, i.e. entirely with active elements. The number of discrete components is reduced and in some circumstances no other external components are required. This makes it possible to implement low-cost, low-power and possibly transportable units. An advantage for the device according to the invention is the symmetrical implementation capability and high reproducibility of the individual circuit elements, such as is possible e.g. in MEMS technology. Interference signals can thus be reduced (especially in the case of amplitude detection).

The noise is also improved by the assembly of frequency-synchronized LC oscillators according to the invention. The assembly of LC oscillators synchronized in frequency has the characteristic of a single oscillator, the noise of which is determined by an injecting oscillator (master).

The device according to the invention makes it possible, for the first time, to generate and detect magnetizations of a sample both in continuous wave mode and in the case of transient magnetization of a sample with improved spin sensitivity and also improved concentration sensitivity. By tapping the amplitude-modulated signals at the individual LC oscillators in the assembly, a spatially resolved signal is additionally available if required. The device can also be implemented in a simplified manner compared with the prior art and is adaptable to different sample environments without any great outlay. The simplified implementation results from the reduction in components, as means for signal processing for the frequency modulation are not required for each LC oscillator in the assembly and in addition the transmission device and the receiving device can be implemented in one assembly (i.e. as one device having both functions). The reduction in the means required for signal processing results from the fact that the LC oscillators in the assembly are synchronized and thus only the frequency of the output voltage of the assembly has to be determined.

Moreover, the excitation of the spins takes place in integrated form, i.e. each LC oscillator in the assembly functions as a transmission device.

Devices according to embodiments of the invention can be used in all fields in which ESR and NMR experiments are carried out as standard, in particular even in imaging methods of medical technology (magnetic resonance tomography, MRT).

FIG. 1 is a schematic view of a device according to an embodiment of the invention for generating and detecting a magnetization of a sample. A magnet 101, which can be, for example, a superconducting magnet, an electromagnet of any design, a permanent magnet or an internal sample-intrinsic magnet (e.g. dipole fields), provides the static magnetic field B0 102 at a sample location at which a sample 103 is arranged. The magnetic field B0 102 induces in the sample 103 a magnetization according to the susceptibility of the sample 103. An assembly of LC oscillators 104 generates an additional magnetic field B1. The assembly of LC oscillators 104 is controlled by a time-dependent waveform, which is used as control voltage $V_{(tune,\omega_{osc})}$ by means of which the frequency of the oscillators in the assembly 104 is determined, and a second time-dependent waveform, which is used to manipulate the amplitude of the oscillation of the LC oscillators in the assembly 104 $V_{tune,A_{osc}}$ (not shown). The time-dependent waveforms can be provided by a personal computer/digital data processing device (not shown) and converted by digital-to-analog converters (not shown). The output voltage V(osc,out) 105 of the assembly of LC oscillators 104 is supplied to an FM demodulator 106, converted by analog-to-digital converters (not shown) and then transferred to a data processing device 107, from which determined values are output. Information about the sample 103, which information is contained in the frequency of the output voltage 105 of the assembly of LC oscillators (for example, resonance energies), is output for further processing, e.g. in the imaging or process control.

The magnetic field, which is generated by the coils through which current flows in the interior of the LC oscillators of the assembly 104, is used to manipulate a magnetization of a sample 103. The resulting change in the sample magnetization in turn causes a change in the inductance of the coils. This change in the individual coils then causes a change in the frequency of the assembly of frequency-synchronized LC oscillators 104. The assembly of frequency-synchronized LC oscillators 104 thus represents a transmission device having an extended active surface area. Moreover, it simultaneously also represents a receiving device for the changes in magnetization produced in a sample, which changes can be determined via the oscillation frequency of the assembly 104, which is a common oscillation frequency of the coupled, frequency-synchronized LC oscillators.

Figure 2:
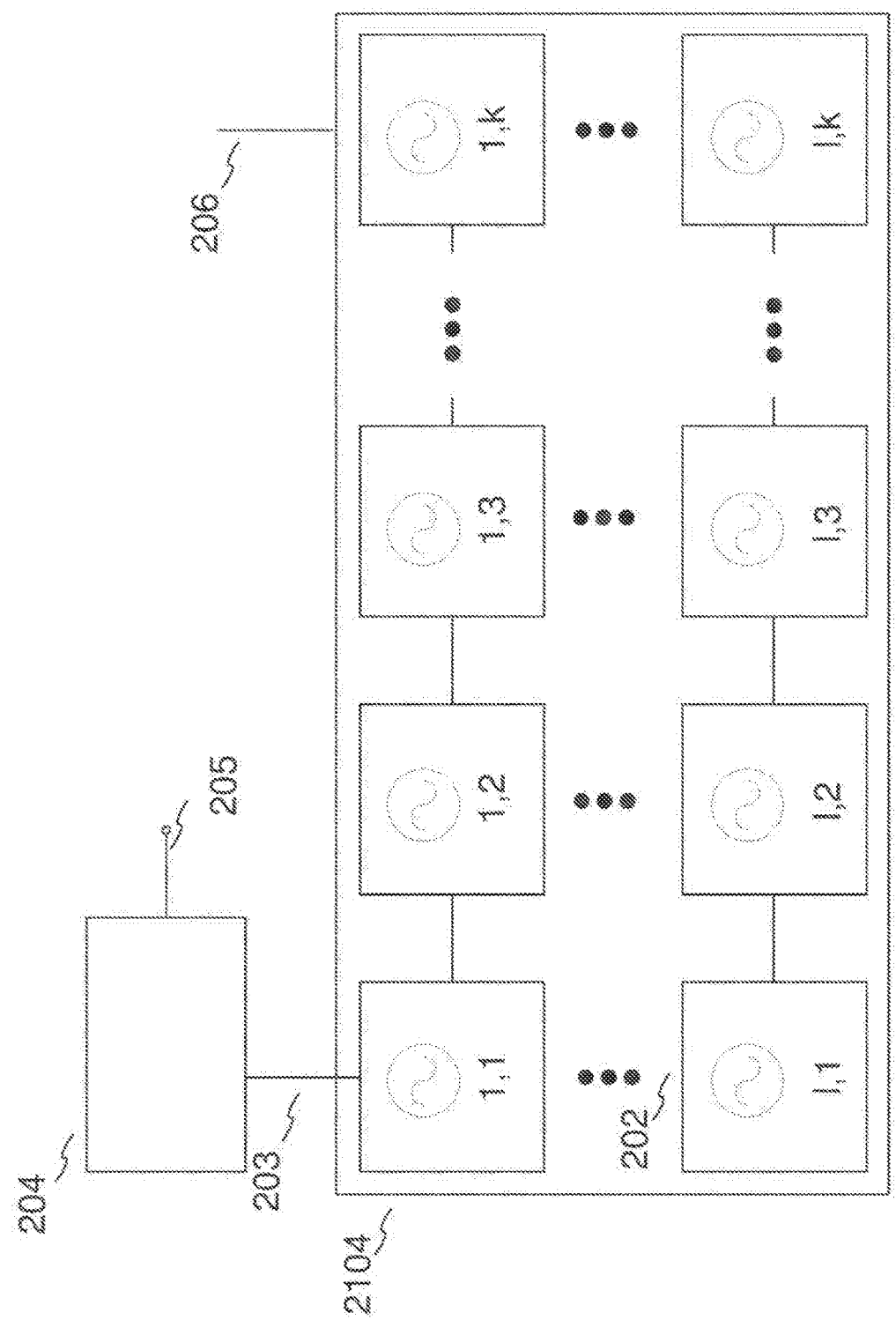
FIG. 2 is a schematic view of an assembly of LC oscillators as a planar composite system.

A generalized view of an assembly 2104 of frequency-synchronized LC oscillators 202 for use as a transmission or receiving device as well as a combination of both is shown in FIG. 2. The geometrical assembly of the LC oscillators is implemented as a planar composite system of individual LC oscillators 202 in rows (l) and columns (k) (l, k), which is also termed an "array". The common oscillation frequency $\omega osc,Array$ of the individual (l×k) coupled, frequency-synchronized LC oscillators 202 is determined in the output voltage 203 of the assembly 2104. Said output voltage is demodulated and processed in the read-out electronics 204, which can comprise e.g. FM and AM demodulators, analog-to-digital converters and data processing systems. The common oscillation frequency of the assembly 2104 of LC oscillators can be controlled from outside by a single control voltage or a set of control voltages Vtune 206.

Figure 3:
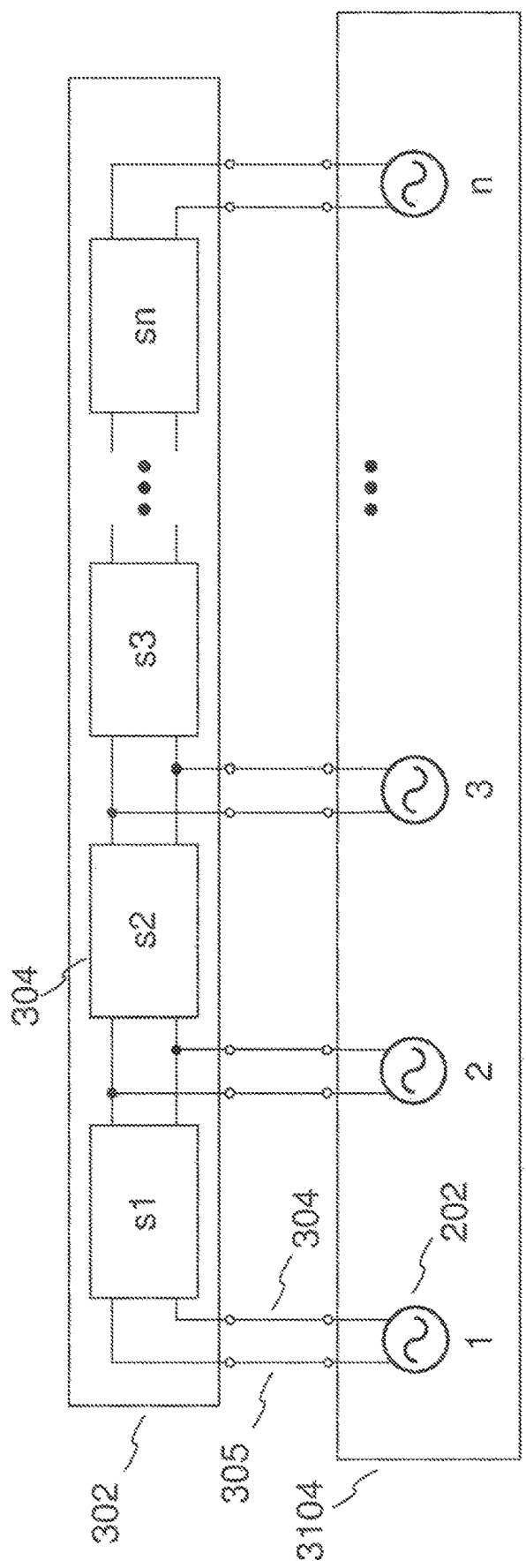
FIG. 3 is a schematic view of an assembly of LC oscillators, which are wired as a coupling network.

An embodiment of a possible wiring for frequency synchronization of the individual LC oscillators 202 in an assembly 3104 is shown in FIG. 3. Here the output 305 of each individual oscillator (1, 2, . . . , n) 202 is fed into the output 304 of another oscillator 202. This takes place through a coupling network 302 which ensures that the output of the individual oscillators 202 is fed by network regions (s1, s2, . . . , sn) 304 into individual or a plurality of other oscillators 202. For the sake of simplicity, only the case in which the output of individual oscillators 202 is fed into individual other oscillators 202 is shown in FIG. 3. The coupling network 302 ensures the frequency synchronization by what is known as "injection locking" (locking/synchronization through supply/injection of a frequency), which causes all oscillators 202 in the network 302 to oscillate at a frequency ω(osc,array).

Figure 4:
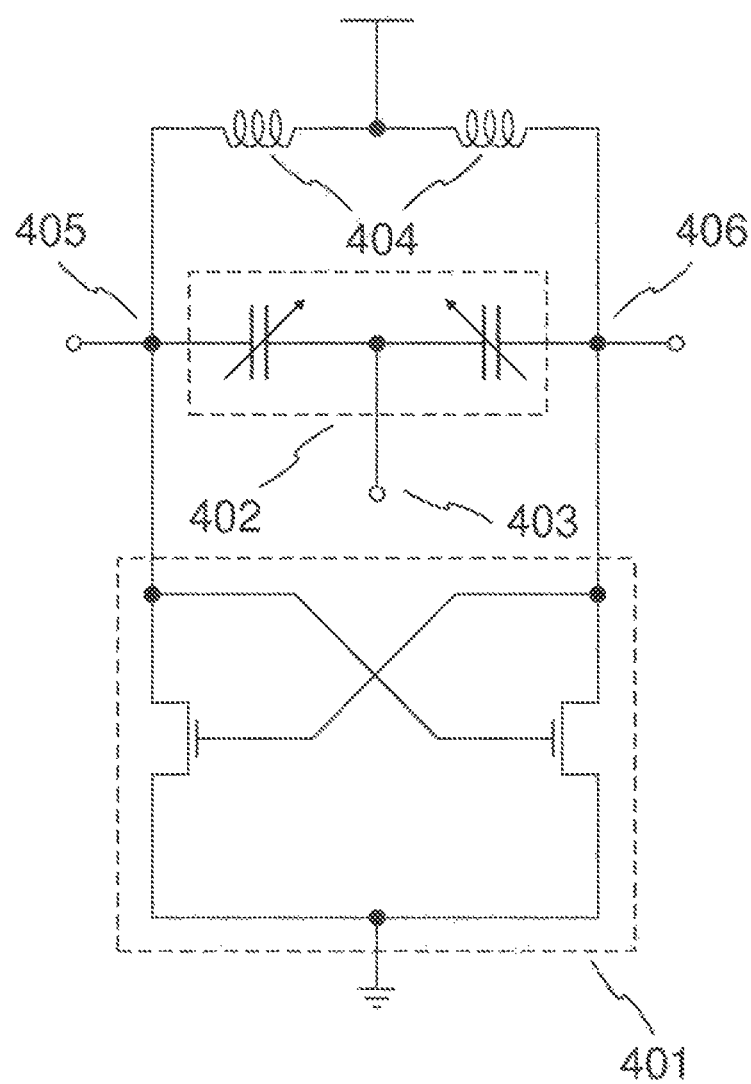
FIG. 4 shows a structure of an LC-VCO for generating and detecting a transient magnetization.

FIG. 4 shows the structure of an LC-VCO for use as an LC oscillator in a device according to an embodiment of the invention for generating and detecting a magnetization, such as it also corresponds to one embodiment. A differential capacitance diode (varactor) 402 and a differential inductor 404 are used to form the LC resonant circuit. Two cross-coupled transistors 401 ensure a stable oscillation in the differential output (i.e. the output voltage) by negative resistance and non-linearity between two nodal points 405/406. The tuning properties are ensured by the differential capacitance diode 402 by means of the control voltage 403. The time-dependent variation of the oscillation amplitude is e.g. implemented by manipulation of the voltage supply of the LC-VCO. The oscillation amplitude is implemented by the modulation of the supply voltage. This simple embodiment of an LC-VCO ensures low power consumption, a small space requirement and in addition operates even at low (down to cryogenic) temperatures.

Figure 5:
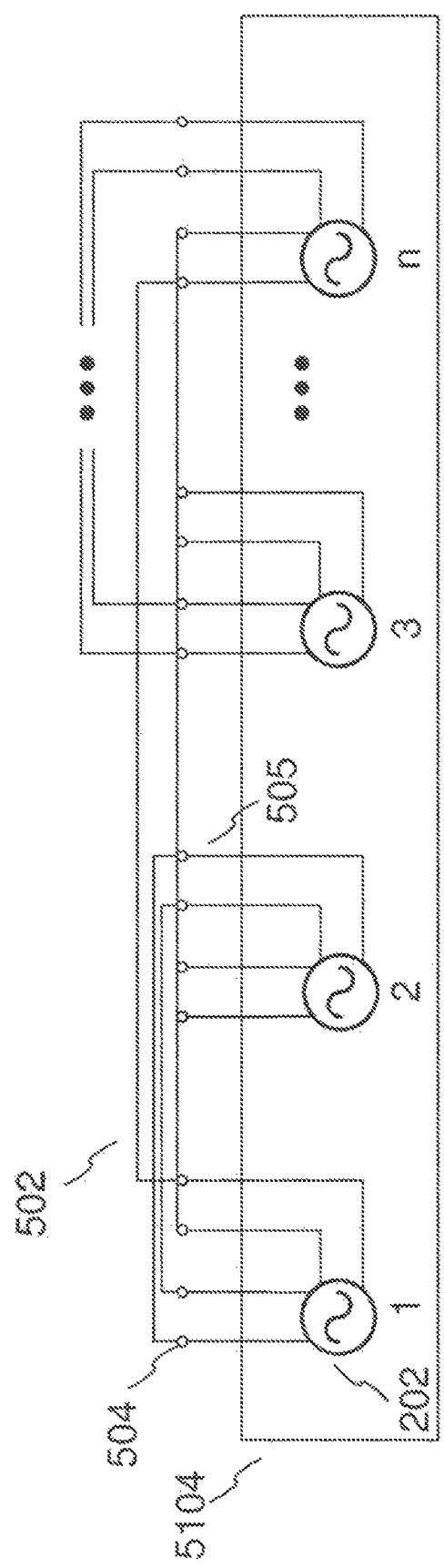
FIG. 5 is a schematic view of an assembly of LC oscillators, which are wired as a network.

Another embodiment of a possible wiring for frequency synchronization of the individual LC oscillators (1, 2, . . . , n) 202 of an assembly 5104 is shown in FIG. 5. Here each oscillator 202 of the assembly 5104 has an additional input 505 into which the output signal 504 of one or more other oscillators is fed. The connection 502 for feeding is effected alternately between the individual oscillators and causes a common oscillation frequency ω(osc,array) of the assembly 5104.

Figure 6:
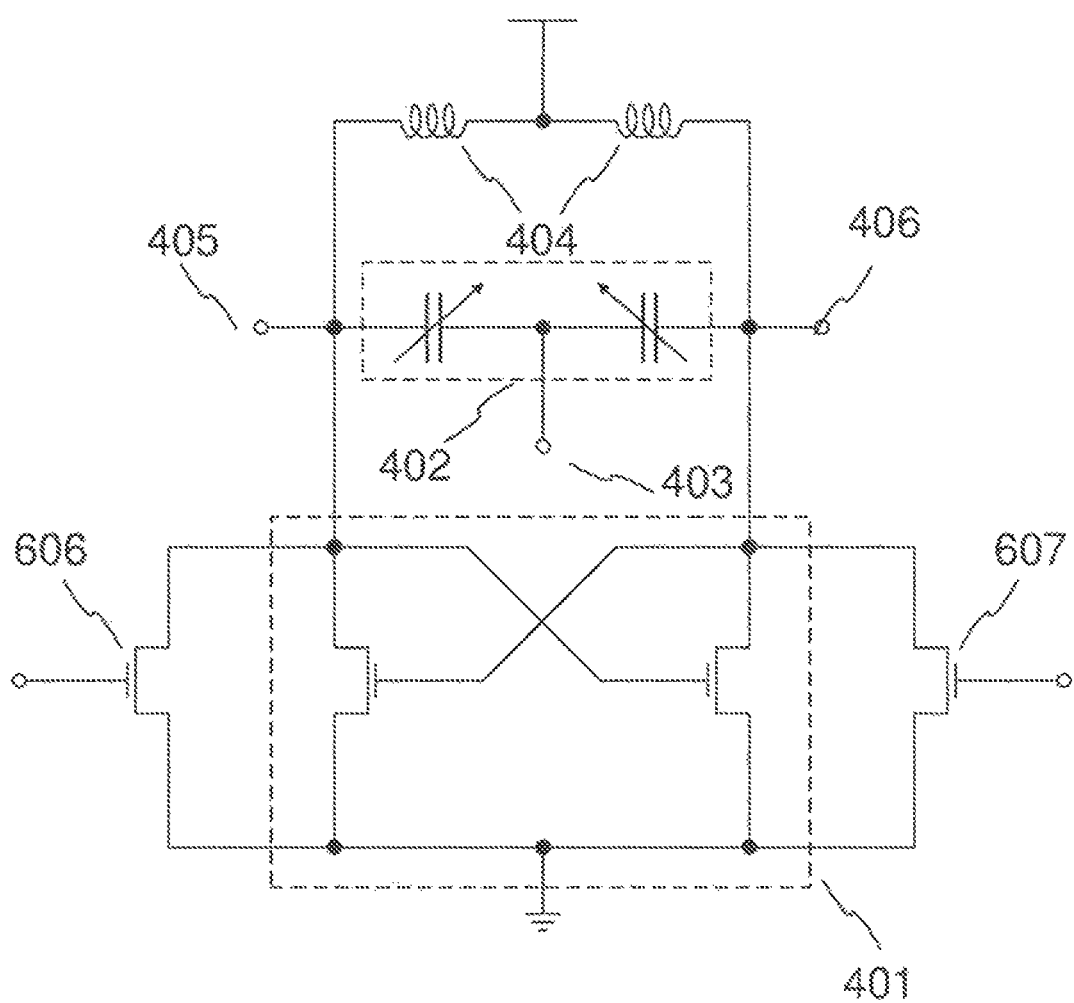
FIG. 6 shows a structure of an LC-VCO for generating and detecting a transient magnetization in an assembly according to FIG. 5.

An LC oscillator such as can be used in an arrangement according to FIG. 5 is shown in FIG. 6. The oscillator corresponds to an LC tank oscillator having a negative resistance, which is provided by the cross-coupled transistor pair 401. The LC tank is formed here by the inductive element 404 and the capacitive element 402, which is voltage-controlled by the control voltage Vtune that is fed in at inputs 403. Additional inputs 606/607, which can be used for frequency synchronization, are provided at the transistor gates. The output voltage of the oscillator, which is used to feed said inputs on other oscillators in the assembly, is tapped at the nodes 405/406.

Figure 7:
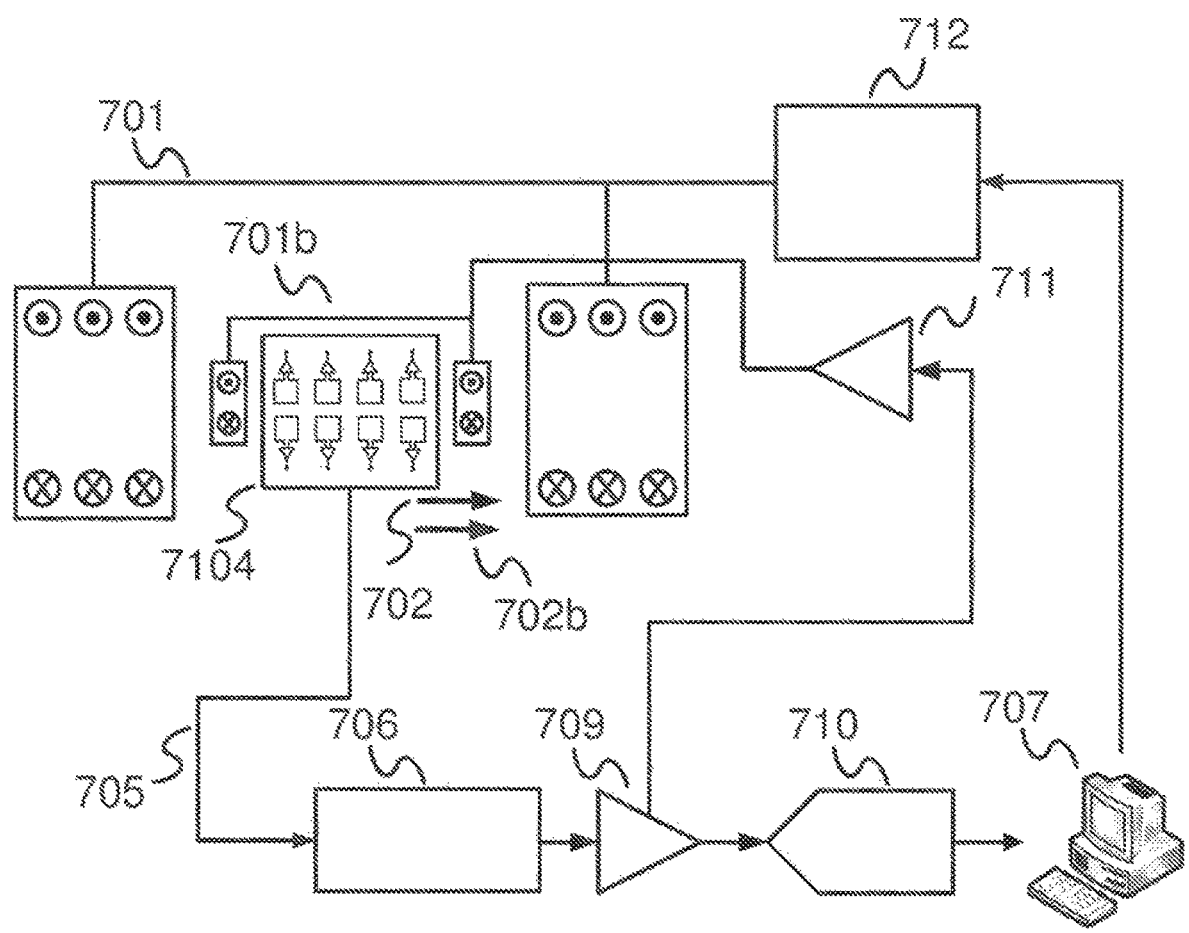
FIG. 7 is a schematic view of a device for generating and detecting magnetic resonance, in which the assembly is used both as a transmission device and as a receiving device and the magnetic field B0 is tunable.

A device according to an embodiment the invention for experiments with field modulation is shown in FIG. 7. The assembly of LC oscillators 7104 is used here simultaneously both as a transmission device for manipulating the magnetization of a sample (not shown) and as a receiving device for detecting the change in the magnetization of the sample. The detection of the change in the magnetization of a sample takes place here due to the change in the frequency of the output voltage ω(osc,array) 705. The experiment is carried out while the static B0 field 702 is being tuned. The tuning is carried out by using a variable field magnet 701, the field of which is modulated by an additional modulation field Bm 702*b* which is generated by modulation coils 701*b*. This permits phase-sensitive detection of the output signal, demodulated by an FM demodulator 706, with the aid of a lock-in amplifier 709. The output signal of the lock-in amplifier is digitalized, using a conventional analog-to-digital converter 710, for further processing. Said further processing takes place in a data processing system 707, on which means are provided for determining the spectral components of the sample based on the model of transient inductance and transient resistance of a coil in the form of a computer program (not shown) and means for outputting the values determined (likewise not shown). A power amplifier 711 provides the current (mostly between some 10 mA and some 100 mA) which is required to generate a sufficiently large (sample-dependent, mostly between some 1 µT and some 100 µT) modulation magnetic field Bm. A control unit 712 is controlled by the data processing system 707, by means of control signals, in order to carry out a frequency sweep of the B0 field.

Figure 8:
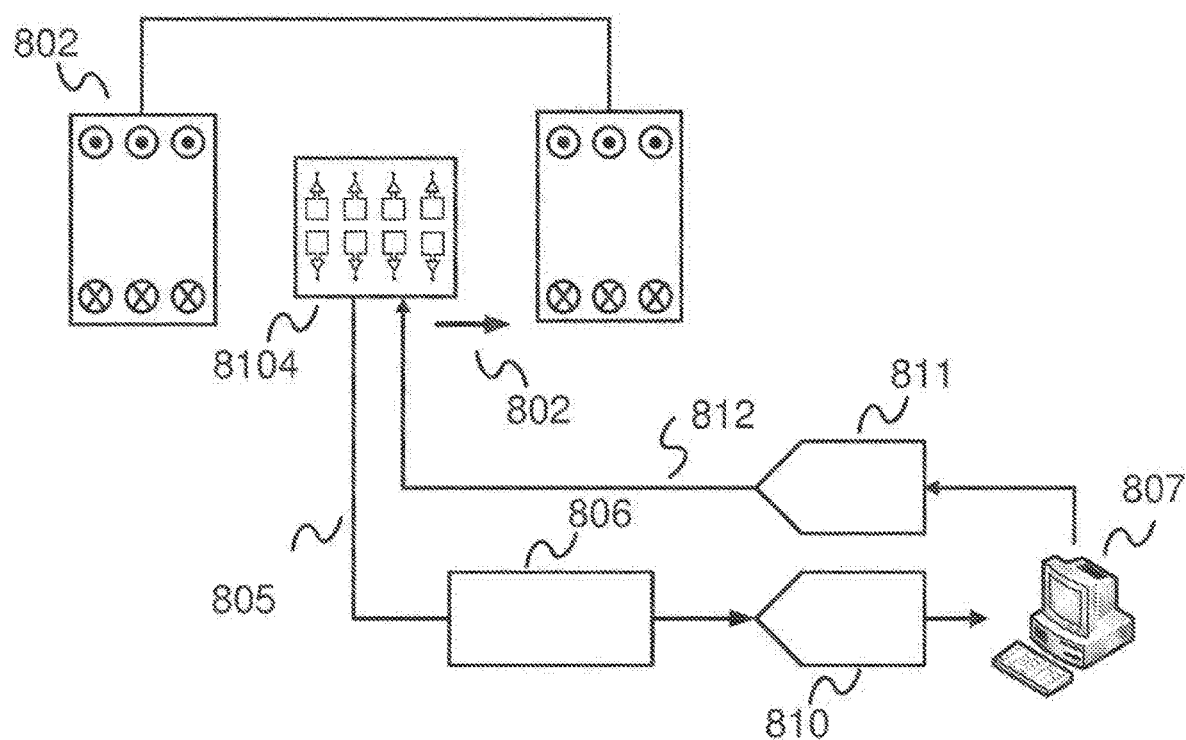
FIG. 8 is a schematic view of a device for generating and detecting magnetic resonance, in which the assembly is used both as a transmission device and as a receiving device and the magnetic field B0 is tunable.

Another device according to an embodiment of the invention for experiments with transient magnetic fields is shown in FIG. 8. The assembly of frequency-synchronized LC oscillators 801 is used here to generate a transient magnetic field. Said field is generated using one or more time-dependent waveforms, which are used as control voltages 812 for the LC oscillators in the assembly 801 and are provided by a digital data processing system 807 and converted using digital-to-analog converters 811. The one or more control voltages 812 is/are fed into one, more or all inputs of the control voltage of the LC oscillators. The transient magnetic field thus generated in the LC oscillators of the assembly 801 is used to manipulate the magnetization of a sample (not shown). The change in the magnetization of a sample is detected via the change in the oscillation frequency ω(osc,array) of the output voltage 805 of the assembly 804. For this purpose, the output voltage 805 of the assembly is demodulated in an FM demodulator 806, then digitalized in an analog-to-digital converter 810 and then supplied to the data processing system 807. In the data processing system 807, means for determining the spectral components of the sample based on the model of transient inductance and transient resistance of a coil are provided, in the form of a computer program (not shown), and means for outputting the values determined are also provided (likewise not shown).

Figure 9:
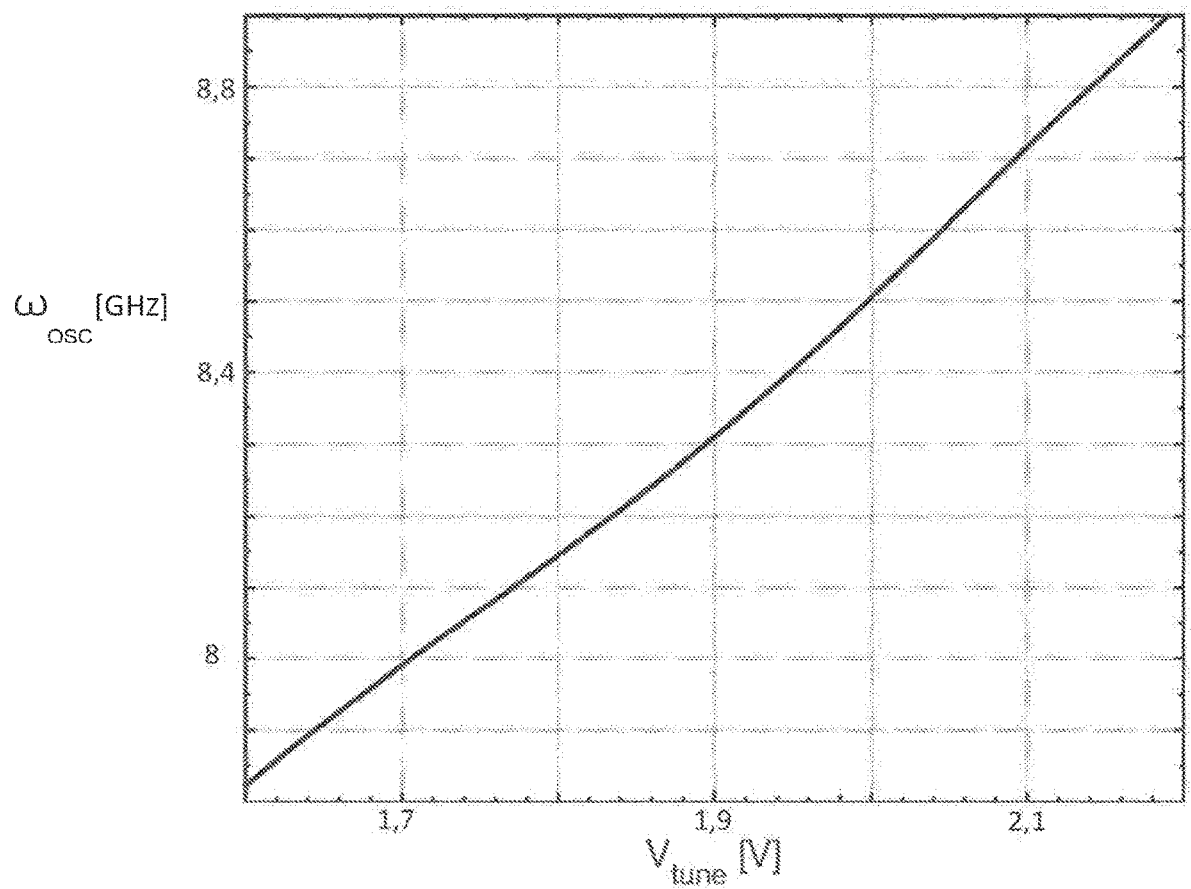
FIG. 9 shows a simulation of the common oscillation frequencies of an assembly of LC oscillators as a function of the control voltage.

FIG. 9 shows a simulation of the dependence of the oscillation frequency of the output voltage ω(osc,array) of an assembly of frequency-synchronized LC oscillators according to FIG. 5 and FIG. 6 on the control voltage. As can be clearly seen, the oscillation frequency of the output voltage of the assembly follows the change in the control voltage of the individual LC oscillators in the assembly.

Figure 10:
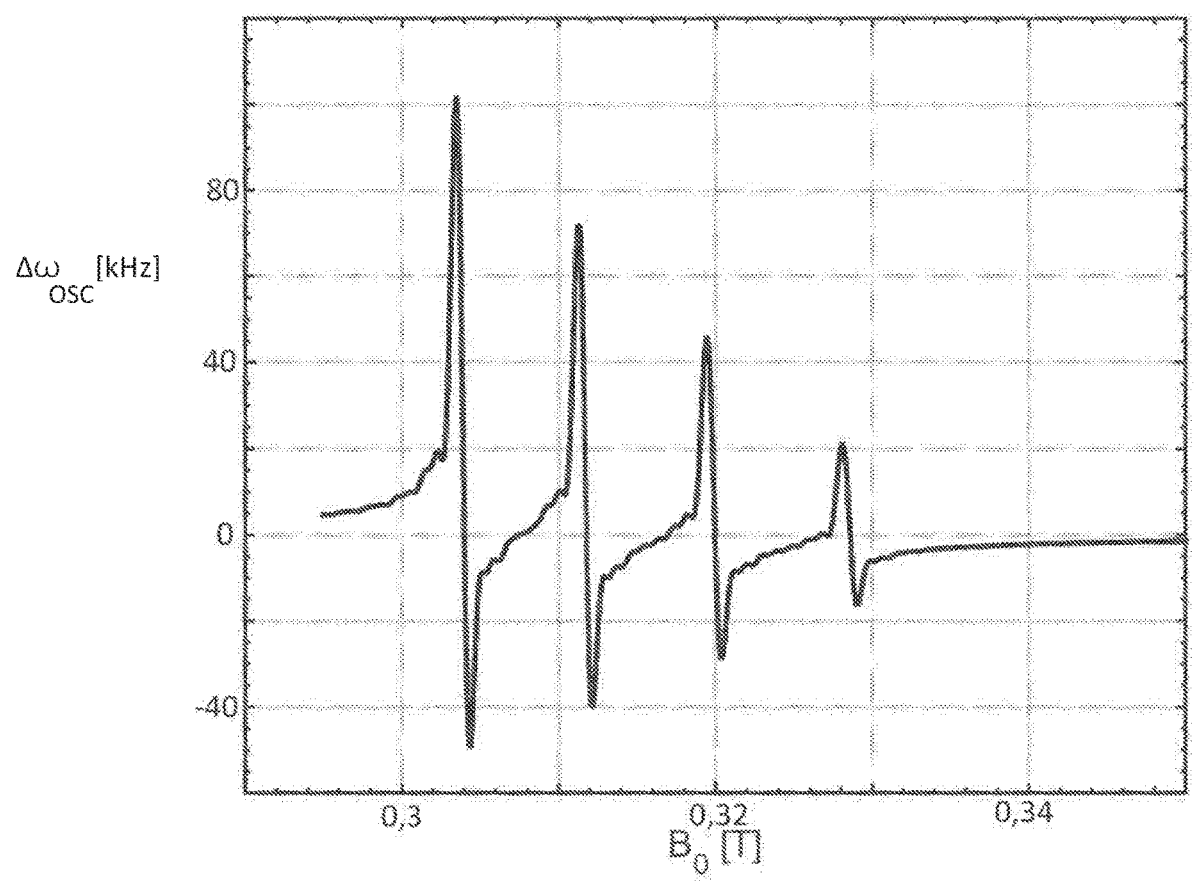
FIG. 10 shows a simulation of the behavior of the common oscillation frequency of an assembly of four LC oscillators in a continuous wave experiment as shown in FIG. 7, each comprising one sample that each have a different g factor and different sample concentration per LC oscillator, during tuning of the field strength.

A simulation of the change in the oscillation frequency of an output voltage Δω(osc,array) of an assembly of four frequency-synchronized LC oscillators, according to FIG. 5 and FIG. 6, is shown in FIG. 10. The change is caused, during an ESR experiment in continuous wave mode, by four samples each having different g factors, which are arranged in the region of the active surface area of the assembly of LC oscillators. The experimental setup here corresponds to that in FIG. 7. As is evident from the figure, the respective change in the magnetization of the four different samples can be determined in the oscillation frequency of the output voltage of the assembly of LC oscillations during the change in the static magnetic field B0. The magnetic fields B0 and B1 must satisfy the resonance conditions of the samples here.

Figure 11:
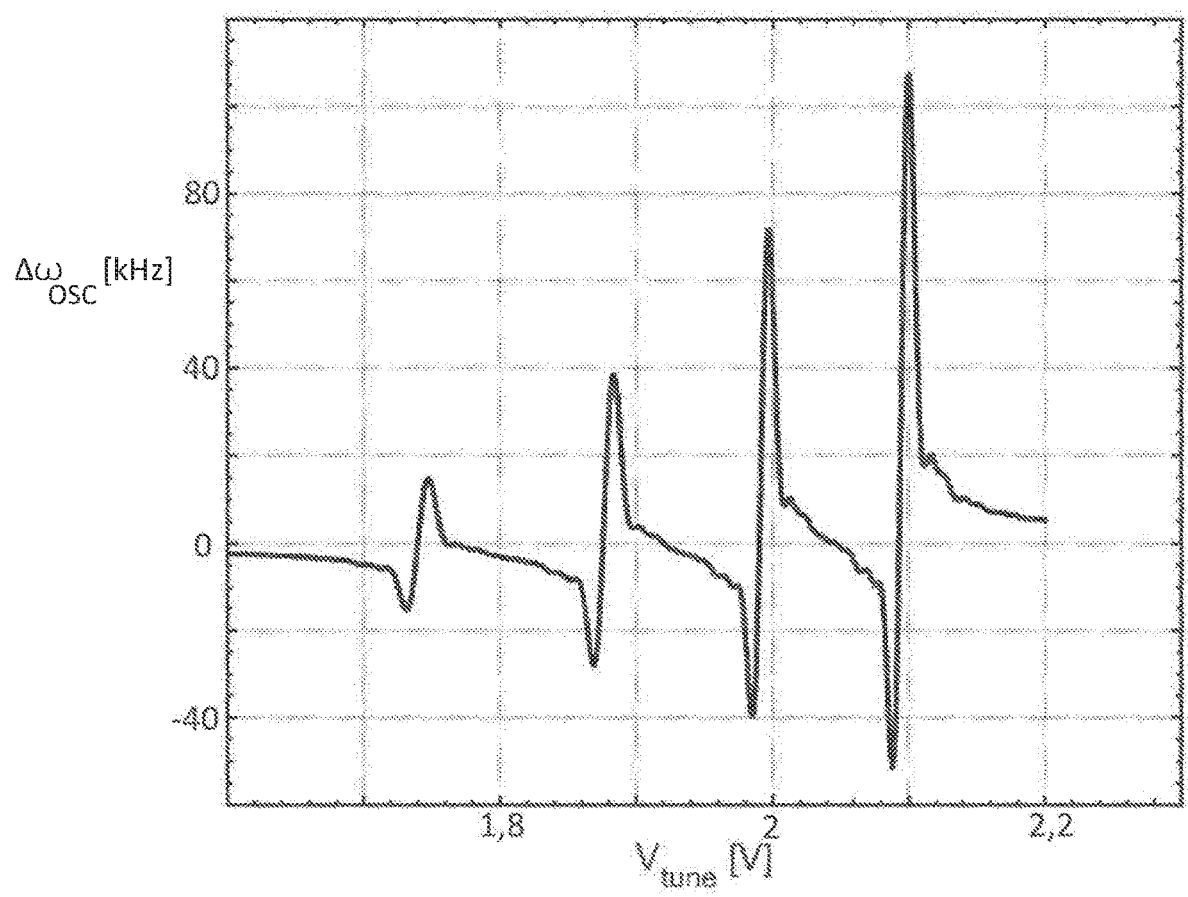
FIG. 11 shows a simulation of the behavior of the common oscillation frequency of an assembly of four LC oscillators in a continuous wave experiment as shown in FIG. 8, each comprising one sample that each have a different I factor and different sample concentration per LC oscillator, during tuning of the free oscillation frequency of the LC oscillators.

A simulation of the change in the oscillation frequency of an output voltage Δω(osc,array) of an assembly of four frequency-synchronized LC oscillators, according to FIG. 5 and FIG. 6, is likewise shown in FIG. 11. The change is caused, during an ESR experiment with a transient magnetic field, by four samples each having different g factors, which are arranged in the region of the active surface area of the assembly of LC oscillators. The experimental setup here corresponds to that in FIG. 8. As is evident from FIG. 11, the respective change in the magnetization of the four different samples during the change in the control voltage, which produces a transient magnetic field in the LC oscillators based on suitable time-dependent waveforms, can be determined in the oscillation frequency of the entire assembly. The magnetic fields B0 and B1 must satisfy the resonance conditions of the samples here.

Figure 12:
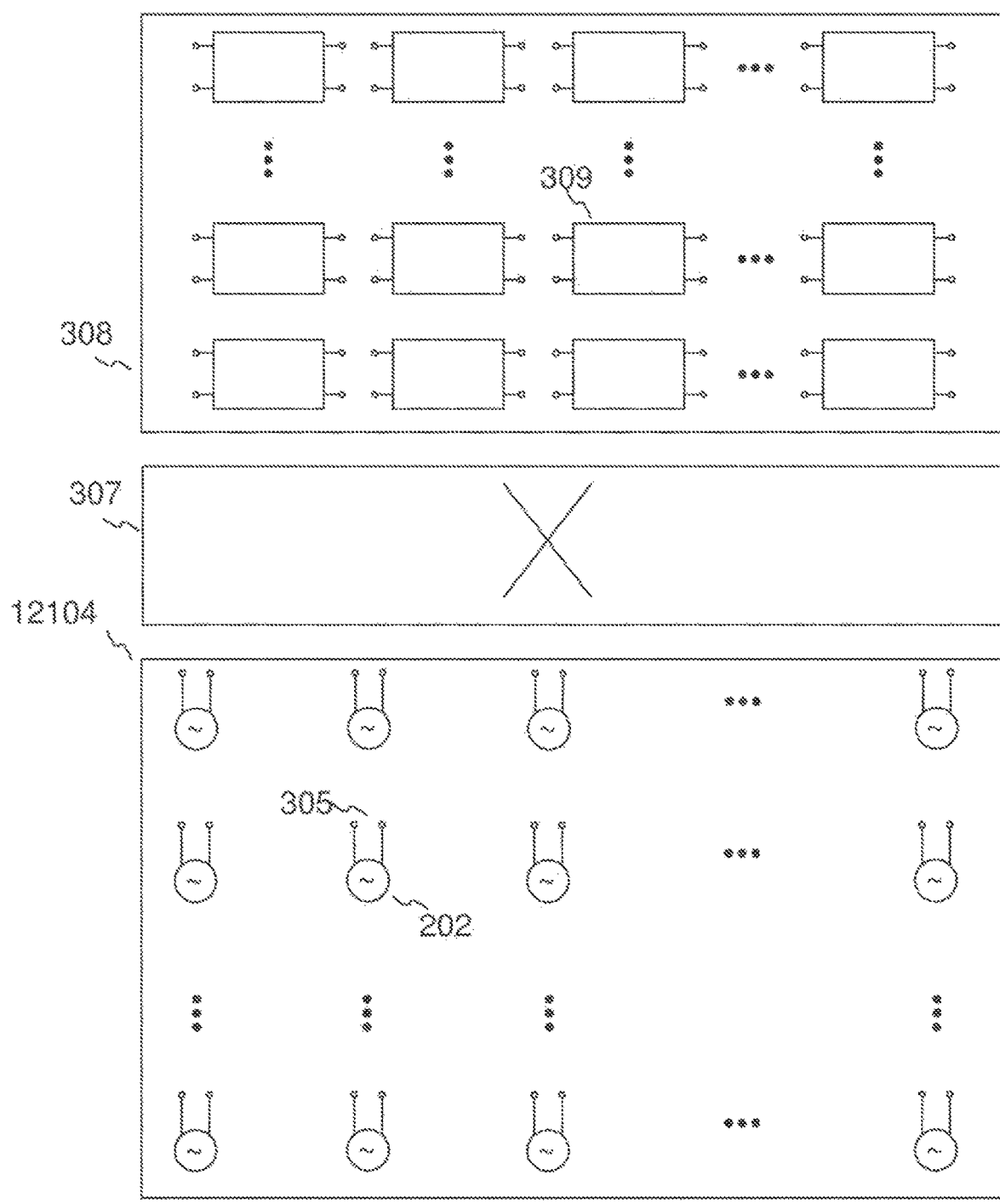
FIG. 12 is a schematic view of a planar assembly of LC oscillators in columns and rows, which are wired as a coupling network.

An embodiment of a possible wiring for frequency synchronization of the individual LC oscillators 202 in a planar assembly 12104 is shown in FIG. 12. Here, the output 305 of each individual oscillator 202 in fed into the output of another oscillator 202. This is done by a coupling network, which ensures that the output of the individual oscillators 202 is fed by network regions 309 into individual or a plurality of other oscillators 202. In this case, 307 is a connection matrix which connects the l×k oscillator outputs of the assembly 12104 to the l×k coupling network 308. The coupling network 308 ensures the frequency synchronization by what is known as "injection locking" (locking/synchronization through supply/injection of a frequency), which causes all the oscillators 202 in the coupling network 308 to oscillate at a frequency ω(osc,array).

Figure 13:
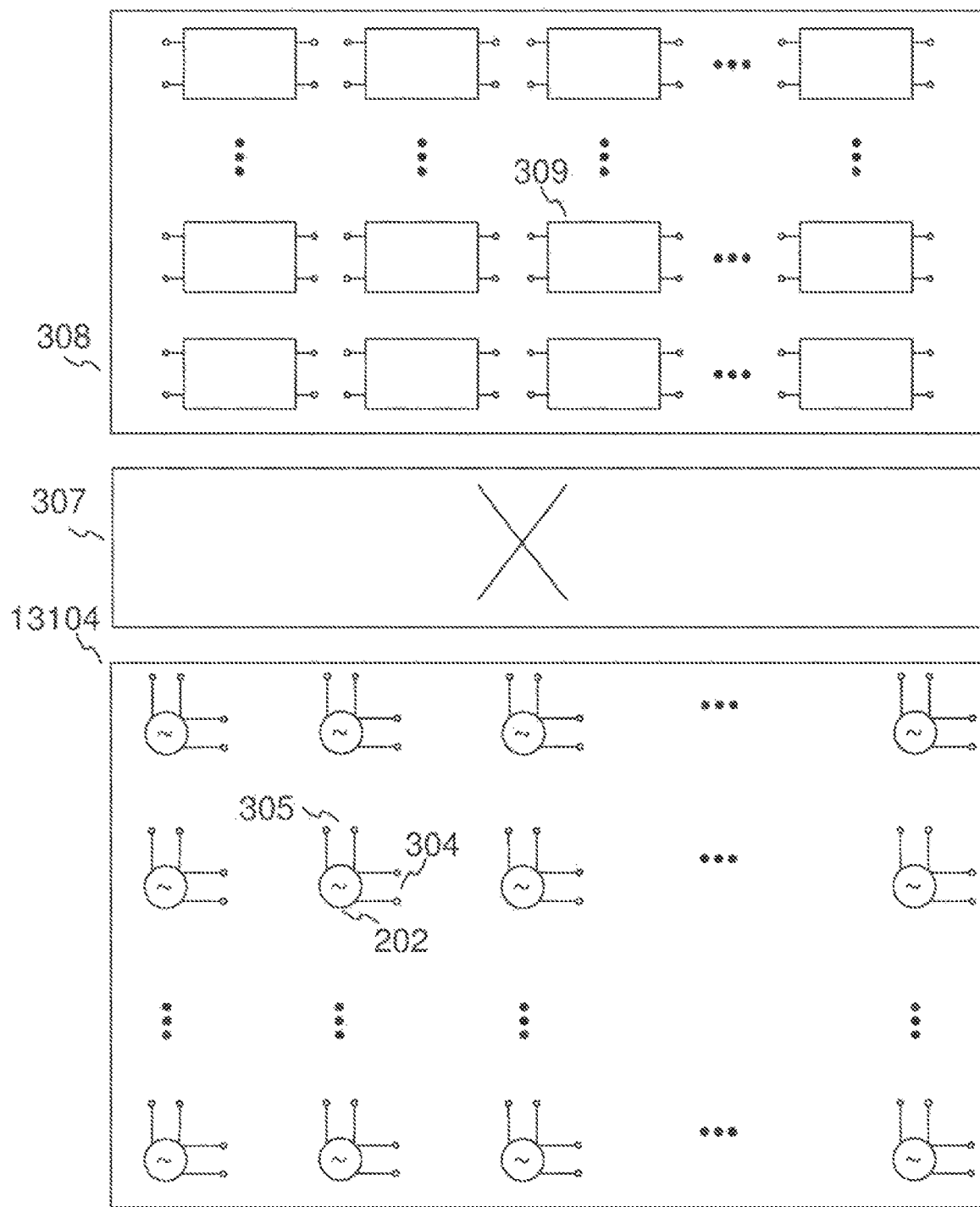
FIG. 13 is a schematic view of a planar assembly of LC oscillators with auxiliary inputs in columns and rows, which are wired as a coupling network.

Another embodiment of a possible wiring for frequency synchronization of the individual LC oscillators 202 in a planar assembly 13104 is shown in FIG. 13. Here, each oscillator 202 in the assembly 13104 has an additional input 505, into which the output signal 504 of one or more other oscillators is fed. The connection for feeding is effected alternately between the individual oscillators and causes a common oscillation frequency ω(osc,array) of the assembly 13104. A connection matrix 307 connects the l×k oscillator outputs of the assembly 13104 to the l×k coupling network 308 with l×k network regions 309. The connection via the connection matrix 307 for feeding is effected alternately between the individual oscillators and causes a common oscillation frequency ω(osc,array) of the assembly 13104.

Figure 14:
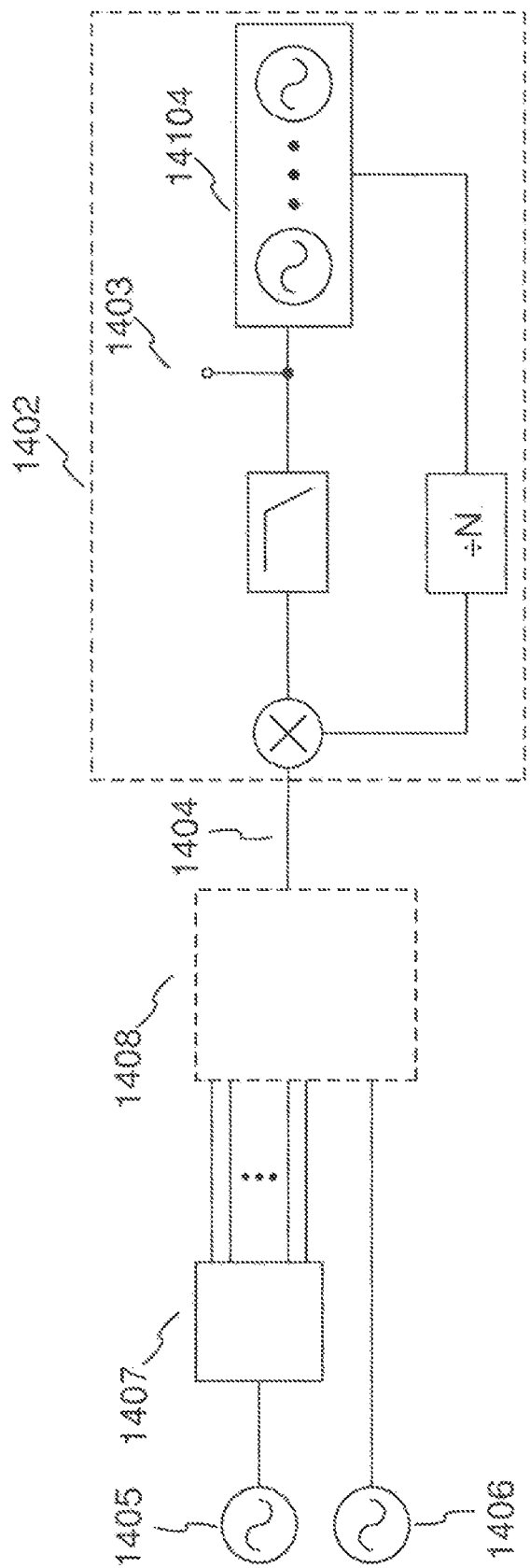
FIG. 14 is a schematic view of an assembly of LC oscillators integrated into a phase locked loop comprising two reference oscillators.

An assembly of LC oscillators 14104 according to an embodiment of the invention, integrated into a phase locked loop 1402, is shown in FIG. 14. In order to achieve the phase locked loop, at least one of the LC oscillators must be implemented as a voltage-controlled oscillator. The phase locked loop 1402 ensues that, in the case of a sequence of excitation pulses (transient magnetic fields) in an ESR or NMR experiment, the phase information of consecutive pulses is not lost between the switching of the assembly 14104 of LC oscillators between an exciting frequency close to or the same as the resonance frequency and a frequency remote from this. The phase coherence is ensured in that a reference frequency ωref 1404 can be selected from two different sources (oscillators ωres 1405, ωoff 1406), which runs continuously at a frequency ωres/N and ωoff/N, with N=division factor of the phase locked loop 1402, ωres a frequency close to or the same as the resonance frequency and ωoff a frequency remote from the resonance frequency. The selection between the two frequencies is made with the aid of a suitable multiplexer 1407. If the reference frequency 1404 of the phase locked loop 1402 is switched between ωoff/N and ωres/N, the frequency of the assembly 14104 of LC oscillators in the phase locked loop 1402 changes accordingly between ωoff and ωres due to the negative feedback in the phase locked loop 1402. Since the oscillators 1405/1406, which are used as sources, run continuously at the same frequencies, i.e. they do not change said frequencies, their phase does not change between two time periods in which their frequency is fed into the assembly either, which is significant in particular for the time periods for ωres. Since, due to its negative feedback structure, the phase locked loop 1402 compares the phase of the assembly 14104 with the phase of the reference oscillator, it is ensured (disregarding short transient responses) that the phase of a sequence of excitation pulses is coherent. Moreover, in order to ensure a coherent change in sequences of excitation pulses and different pulse sequences (phase cycling), the circuit according to FIG. 14 can be expanded by two additional sources for reference frequencies, which run with a 90° phase difference to the sources from FIG. 14. This allows an excitation in the x' and y' direction of the rotating coordinate system (rotating frame of reference). The circuit can also be expanded to allow excitations of further directions by adding other sources for reference frequencies with corresponding phase differences. An output 1403, at which frequency-demodulated signals can be tapped directly, is additionally provided.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A device for generating and detecting a magnetization of a sample, the device comprising:
a magnetic field generator configured to generate a static magnetic field of a predetermined direction and strength at a sample location;
a transmitter configured to provide an additional magnetic field at the sample location; and
a receiver configured to detect a magnetization of the sample,
wherein an assembly of at least two LC oscillators, the oscillation frequency of which is a function of a value of an inductive element of the LC oscillators and which are frequency-synchronized via a wiring, and forced by a control voltage to have a same oscillation frequency, is used as the receiver and/or the transmitter,
wherein a controller configured to control the assembly is connected,
wherein the assembly and the controller are configured to generate a magnetic field capable of deflecting a magnetization of the sample out of equilibrium,
wherein the sample location lies in a near field of the assembly,
wherein a demodulator and analog-to-digital converters as well as a digital data processor are connected downstream of the assembly for processing an output voltage of the assembly,
wherein a spectral component determiner configured to determine spectral components of the magnetization of the sample and the spin concentration of individual spectral components to be determined therefrom and an output configured to output the magnetization are provided in the digital data processor
wherein one of the LC oscillators in the assembly is executed as a voltage-controlled oscillator and a phase locked loop is connected, so that all LC oscillators in the assembly follow a reference frequency.

2. The device according to claim 1, wherein the wiring of the assembly of LC oscillators is executed as a coupling network.

3. The device according to claim 1, wherein the wiring of the assembly of LC oscillators is executed as a network, wherein each LC oscillator has an additional input, and wherein an output voltage of at least one other LC oscillator is fed into the additional input, wherein the LC oscillators are at least each wired bilaterally to one another.

4. The device according to claim 1, wherein the LC oscillators are implemented as LC-VCOs.

5. The device according to claim 1, wherein the assembly and the controller are sufficient to generate a transient magnetic field, which is capable of deflecting a magnetization of the sample out of equilibrium and the spectral component determiner is based on a physical model of transient inductance and transient resistance of a coil.

6. The device according to claim 5, wherein the spectral component determiner includes a term corresponding to $$\omega_{osc} = \frac{1}{\sqrt{L_0 \cdot C}} - \frac{1}{2} \cdot \frac{1}{(L_0 \cdot C)^{\frac{3}{2}}} \cdot C \cdot \Delta L_{sample},$$

with $\omega_{osc}$=frequency of an LC oscillator, C=capacitance of the coil, $L_0$=sample-independent inductance of the coil, $\Delta L_{sample}$=sample-dependent change in the inductance of the coil.

7. The device according to claim 5, wherein the demodulator is an amplitude demodulator and the spectral component determiner includes a term corresponding to:

$$A_{osc} = A_{osc}\bigg|_{R_{eff}=R_0} + \frac{\partial A_{osc}}{\partial R_{eff}}\bigg|_{R_{eff}=R_0} \cdot R_{sample,tot}$$

with $A_{osc}$=oscillation amplitude of an LC oscillator, $R_{eff}$=effective resistance of the coil, $R_0$=ohmic coil resistance and $R_{sample,tot}$=resistance of the coil induced by the sample.

8. The device according to claim 6, wherein the demodulator comprises a frequency demodulator and an amplitude demodulator, and the spectral component determiner comprises a term corresponding to $$\omega_{osc} = \frac{1}{\sqrt{L_0 \cdot C}} - \frac{1}{2} \cdot \frac{1}{(L_0 \cdot C)^{\frac{3}{2}}} \cdot \Delta L_{sample}$$

and $$A_{osc} = A_{osc}|_{R_{eff}=R_0} + \frac{\partial A_{osc}}{\partial R_{eff}}\bigg|_{R_{eff}=R_0} \cdot R_{sample,tot}.$$

* * * * *